(12) United States Patent
Tawyer et al.

(10) Patent No.: US 10,957,569 B2
(45) Date of Patent: Mar. 23, 2021

(54) ACCESS TO ONE OR MORE LEVELS OF MATERIAL STORAGE SHELVES BY AN OVERHEAD HOIST TRANSPORT VEHICLE FROM A SINGLE TRACK POSITION

(75) Inventors: Jeffrey T. Tawyer, Danvers, MA (US); Brian Doherty, Weston, MA (US)

(73) Assignee: Murata Machinery Ltd., Kyoto (JP)

( * ) Notice: Subject to any disclaimer, the term of this patent is extended or adjusted under 35 U.S.C. 154(b) by 0 days.

(21) Appl. No.: 10/682,809

(22) Filed: Oct. 9, 2003

(65) Prior Publication Data

US 2004/0126208 A1    Jul. 1, 2004

Related U.S. Application Data

(60) Provisional application No. 60/417,993, filed on Oct. 11, 2002.

(51) Int. Cl.
*H01L 21/677* (2006.01)
*B65G 1/04* (2006.01)

(52) U.S. Cl.
CPC ...... *H01L 21/67733* (2013.01); *B65G 1/0457* (2013.01); *H01L 21/67769* (2013.01)

(58) Field of Classification Search
CPC .................. H01L 21/67733; H01L 21/67769
(Continued)

(56) References Cited

U.S. PATENT DOCUMENTS

| 328,408 A | 10/1885 | Isbell |
| 343,293 A | 6/1886 | Bowen |

(Continued)

FOREIGN PATENT DOCUMENTS

| DE | 38 25 401 A1 | 1/1990 |
| DE | 3825401 A1 | 1/1990 |

(Continued)

OTHER PUBLICATIONS

A machine translation of Ueda, JP 2001-171970.*

(Continued)

*Primary Examiner* — Michael R Mansen
*Assistant Examiner* — Juan J Campos, Jr.
(74) *Attorney, Agent, or Firm* — Fish & Richardson P.C.

(57) ABSTRACT

An improved automated material handling system that allows an overhead hoist supported by a suspended track to access Work-In-Process (WIP) parts from storage locations beside the track. The automated material handling system includes an overhead hoist transport vehicle for transporting an overhead hoist on a suspended track, and one or more storage bins for storing WIP parts located beside the track. Each storage bin is either a movable shelf or a fixed shelf. To access a WIP part from a selected shelf, the overhead hoist transport vehicle moves along the suspended track to a position at the side of the shelf. Next, the movable shelf moves to a position underneath the overhead hoist. Alternatively, overhead hoist moves to a position above the fixed shelf. The overhead hoist is then operated to pick a desired WIP part directly from the shelf, or to place one or more WIP parts directly to the shelf. Once the WIP part is held by the overhead hoist, the overhead hoist transport vehicle moves the WIP part to a workstation or processing machine on the product manufacturing floor.

23 Claims, 15 Drawing Sheets

(58) Field of Classification Search
USPC .................................. 414/279, 280, 626, 940
See application file for complete search history.

(56) References Cited

U.S. PATENT DOCUMENTS

| | | | |
|---|---|---|---|
| 1,352,947 A | 9/1920 | Fiske | |
| 2,317,689 A | 4/1943 | Medenwald | |
| 2,827,189 A | 3/1958 | Knudstrup | |
| 3,042,227 A | 7/1962 | Tantlinger | |
| 3,049,247 A | 8/1962 | Lemelson | |
| 3,119,501 A | 1/1964 | Lemelson | |
| 3,422,967 A | 1/1969 | Aron | |
| 3,467,264 A | 9/1969 | Boytz et al. | |
| 3,499,554 A * | 3/1970 | Davis et al. | 414/283 |
| 3,531,002 A * | 9/1970 | Lemelson | 414/273 |
| 3,583,584 A | 6/1971 | Iacco | 214/16.4 |
| 3,700,121 A | 10/1972 | McManus | |
| 3,701,442 A | 10/1972 | Dunning et al. | |
| 3,750,804 A * | 8/1973 | Lemelson | 414/276 |
| 3,762,531 A * | 10/1973 | Lee | 414/280 |
| 3,770,137 A | 11/1973 | Slutsky et al. | |
| 3,883,203 A | 5/1975 | Lexe | |
| 3,968,885 A | 7/1976 | Hassan et al. | |
| 4,088,232 A * | 5/1978 | Lilly | 414/282 |
| 4,190,013 A * | 2/1980 | Otis et al. | 114/263 |
| 4,243,147 A | 1/1981 | Twitchell et al. | |
| 4,311,427 A | 1/1982 | Coad et al. | |
| 4,398,630 A | 8/1983 | Brems | |
| 4,457,661 A | 7/1984 | Flint et al. | |
| 4,540,326 A | 9/1985 | Southworth et al. | |
| 4,541,769 A * | 9/1985 | Clemens | 414/633 |
| 4,642,017 A | 2/1987 | Fenn | |
| 4,668,484 A | 5/1987 | Elliot | |
| 4,676,560 A | 6/1987 | Schmitz et al. | |
| 4,682,927 A | 7/1987 | Southworth et al. | |
| 4,697,239 A | 9/1987 | Sicard et al. | |
| 4,756,657 A * | 7/1988 | Kinney | 414/281 |
| 4,775,281 A | 10/1988 | Prentakis | |
| 4,776,744 A | 11/1988 | Stonestreet et al. | |
| 4,801,236 A | 1/1989 | Katzenschwanz | |
| 4,816,116 A | 3/1989 | Davis et al. | |
| 4,886,412 A | 12/1989 | Wooding et al. | |
| 4,903,610 A | 2/1990 | Matsumoto et al. | |
| 4,934,767 A | 6/1990 | Hoyt, III et al. | 312/330.1 |
| 4,979,360 A * | 12/1990 | Kallmann | B65H 67/065 104/89 |
| 5,064,337 A | 11/1991 | Asakawa et al. | |
| 5,083,262 A | 1/1992 | Haff | |
| 5,096,357 A * | 3/1992 | Galbani | 414/331.11 |
| 5,128,912 A * | 7/1992 | Hug et al. | 369/30.61 |
| 5,324,155 A | 6/1994 | Goodwin et al. | |
| 5,380,139 A * | 1/1995 | Pohjonen et al. | 414/280 |
| 5,417,537 A | 5/1995 | Miller | |
| 5,536,128 A | 7/1996 | Shimoyashiro et al. | |
| 5,570,990 A | 11/1996 | Bonora et al. | |
| 5,603,777 A | 2/1997 | Ohashi | |
| 5,615,988 A | 4/1997 | Wiesler et al. | |
| 5,628,604 A | 5/1997 | Murata et al. | |
| 5,630,692 A * | 5/1997 | Hanaya | 414/277 |
| 5,647,718 A | 7/1997 | Wiesler et al. | |
| 5,655,870 A * | 8/1997 | Yasuhara et al. | 414/273 |
| 5,741,109 A | 4/1998 | Wiesler et al. | |
| 5,751,581 A | 5/1998 | Tau et al. | |
| 5,836,662 A | 11/1998 | Robey | |
| 5,893,795 A | 4/1999 | Perlov et al. | |
| 5,909,997 A | 6/1999 | Liljengren et al. | |
| 5,947,802 A | 9/1999 | Zhang et al. | |
| 5,980,183 A * | 11/1999 | Fosnight | 414/222.01 |
| 5,993,148 A | 11/1999 | Brown | |
| 6,002,840 A | 12/1999 | Hofmeister | |
| 6,035,245 A | 3/2000 | Conboy et al. | |
| 6,050,768 A | 4/2000 | Iwasaki et al. | |
| 6,068,437 A | 5/2000 | Boje et al. | |
| 6,078,845 A | 6/2000 | Friedman | |
| 6,086,457 A | 7/2000 | Perlov et al. | |
| 6,092,678 A | 7/2000 | Kawano et al. | |
| 6,092,978 A | 7/2000 | Kawano et al. | |
| 6,095,054 A | 8/2000 | Kawano et al. | |
| 6,102,647 A | 8/2000 | Yap | |
| 6,113,341 A | 9/2000 | Fukushima | |
| 6,129,496 A | 10/2000 | Iwasaki et al. | |
| 6,134,482 A | 10/2000 | Iwasaki | |
| 6,169,935 B1 | 1/2001 | Iwasaki et al. | |
| 6,183,184 B1 | 2/2001 | Shiwaku | |
| 6,240,335 B1 | 5/2001 | Wehrung et al. | 700/230 |
| 6,251,155 B1 | 6/2001 | Fukushima | |
| 6,303,398 B1 | 10/2001 | Goerigk | |
| 6,308,818 B1 | 10/2001 | Bonora et al. | |
| 6,315,512 B1 | 11/2001 | Tabrizi et al. | |
| 6,336,546 B1 | 1/2002 | Lorenz | |
| 6,356,256 B1 | 3/2002 | Leftwich | |
| 6,356,804 B1 | 3/2002 | Conboy et al. | |
| 6,361,422 B1 | 3/2002 | Ettinger et al. | |
| 6,364,593 B1 | 4/2002 | Hofmeister et al. | |
| 6,398,476 B1 | 6/2002 | Ando | |
| 6,439,822 B1 | 8/2002 | Kimura et al. | |
| 6,450,318 B1 | 9/2002 | Minardi | |
| 6,453,574 B1 | 9/2002 | Chen | |
| 6,460,711 B1 | 10/2002 | Kato et al. | |
| 6,504,144 B1 | 1/2003 | Murata | |
| 6,519,502 B2 | 2/2003 | Chao | |
| 6,530,735 B1 | 3/2003 | Trammell | |
| 6,564,120 B1 * | 5/2003 | Richard et al. | 700/214 |
| 6,579,052 B1 * | 6/2003 | Bonora et al. | 414/222.01 |
| 6,604,624 B2 * | 8/2003 | Hirata et al. | 198/494 |
| 6,695,120 B1 * | 2/2004 | Trammell | 198/375 |
| 6,715,978 B2 | 4/2004 | Lin et al. | |
| 6,726,429 B2 * | 4/2004 | Sackett et al. | 414/217 |
| 6,748,282 B2 | 6/2004 | Lin | |
| 6,758,647 B2 * | 7/2004 | Kaji et al. | 414/217 |
| 6,775,918 B2 | 8/2004 | Tseng et al. | |
| 6,812,926 B1 | 11/2004 | Rugge | |
| 6,881,020 B2 | 4/2005 | Chang et al. | |
| 6,923,612 B2 * | 8/2005 | Hansl | B65G 1/0435 414/277 |
| 7,023,440 B1 | 4/2006 | Havekost et al. | |
| 7,134,825 B1 * | 11/2006 | Schmutz | H01L 21/67769 414/217.1 |
| 7,165,927 B2 | 1/2007 | Doherty et al. | |
| 7,292,245 B2 | 11/2007 | Goggin | |
| 7,441,999 B2 | 10/2008 | Nakao et al. | |
| 7,570,262 B2 | 8/2009 | Landau et al. | |
| 7,686,176 B2 | 3/2010 | Murata | |
| 7,771,153 B2 | 8/2010 | Doherty et al. | |
| 7,907,140 B2 | 3/2011 | Landau et al. | |
| 8,113,844 B2 | 2/2012 | Huang et al. | |
| 8,197,172 B2 | 6/2012 | Doherty et al. | |
| 8,224,953 B2 | 7/2012 | Childers | |
| 8,269,620 B2 | 9/2012 | Bullemer et al. | |
| 8,271,892 B2 | 9/2012 | Duncker et al. | |
| 9,620,397 B2 | 4/2017 | Doherty et al. | |
| 9,881,823 B2 | 1/2018 | Doherty et al. | |
| 10,141,212 B2 | 11/2018 | Doherty et al. | |
| 10,147,627 B2 | 12/2018 | Doherty et al. | |
| 2001/0014268 A1 | 8/2001 | Bryson, III et al. | |
| 2002/0025244 A1 | 2/2002 | Kim | |
| 2002/0105236 A1 * | 8/2002 | Fosnight et al. | 307/326 |
| 2002/0143426 A1 | 10/2002 | Chao | |
| 2002/0143427 A1 | 10/2002 | Chao | |
| 2002/0182037 A1 | 12/2002 | Kimoto et al. | |
| 2002/0182040 A1 | 12/2002 | Kimura et al. | |
| 2002/0187024 A1 * | 12/2002 | Nulman | 414/217 |
| 2002/0197136 A1 | 12/2002 | Huang et al. | |
| 2003/0014699 A1 | 1/2003 | Kallela | |
| 2003/0023518 A1 | 1/2003 | Spriggs | |
| 2003/0156928 A1 | 8/2003 | Sackett et al. | |
| 2003/0190223 A1 | 10/2003 | Peiter | |
| 2003/0198540 A1 | 10/2003 | Lin et al. | |
| 2003/0235486 A1 | 12/2003 | Doherty et al. | |
| 2004/0027349 A1 | 2/2004 | Landau et al. | |
| 2004/0101386 A1 | 5/2004 | Robey | |
| 2004/0109746 A1 | 6/2004 | Suzuki | |
| 2004/0126208 A1 | 7/2004 | Tawyer et al. | |
| 2004/0191032 A1 | 9/2004 | Foulke et al. | |

(56) References Cited

U.S. PATENT DOCUMENTS

| | | | |
|---|---|---|---|
| 2005/0097471 | A1 | 5/2005 | Faraday et al. |
| 2005/0162423 | A1 | 7/2005 | Goggin |
| 2005/0177790 | A1 | 8/2005 | Molander et al. |
| 2005/0261999 | A1 | 11/2005 | Rowady |
| 2006/0074598 | A1 | 4/2006 | Emigholz et al. |
| 2007/0018984 | A1 | 1/2007 | Sauvageau |
| 2007/0110547 | A1 | 5/2007 | Doherty et al. |
| 2007/0242688 | A1 | 10/2007 | McFarland |
| 2008/0313560 | A1 | 12/2008 | Dalai |
| 2009/0088534 | A1 | 4/2009 | Scheie |
| 2009/0183095 | A1 | 7/2009 | Deitsch et al. |
| 2010/0174405 | A1 | 7/2010 | Doherty et al. |
| 2012/0288348 | A1 | 11/2012 | Doherty et al. |
| 2014/0119857 | A1 | 5/2014 | Doherty et al. |
| 2015/0303087 | A1 | 10/2015 | Doherty et al. |
| 2015/0303088 | A1 | 10/2015 | Doherty et al. |
| 2015/0303089 | A1 | 10/2015 | Doherty et al. |

FOREIGN PATENT DOCUMENTS

| | | | | |
|---|---|---|---|---|
| DE | 3825401 | | 7/1990 | |
| EP | 1063056 | A2 | 12/2000 | |
| EP | 1063056 | A2 | 12/2000 | |
| EP | 1 202 325 | | 5/2002 | |
| EP | 1 202 325 | A1 | 5/2002 | |
| EP | 1202325 | | 5/2002 | |
| JP | 59-37205 | | 3/1984 | |
| JP | 62-297050 | | 12/1987 | |
| JP | 63-37626 | | 2/1988 | |
| JP | 01285512 | A * | 11/1989 | ............... B65G 1/00 |
| JP | H 0227838 | | 2/1990 | |
| JP | 2-117506 | | 5/1990 | |
| JP | 03-177205 | | 5/1991 | |
| JP | H03177205 | | 8/1991 | |
| JP | 3-225847 | | 10/1991 | |
| JP | 5-186050 | | 7/1993 | |
| JP | 5-77183 | | 10/1993 | |
| JP | 5-278853 | | 10/1993 | |
| JP | 6-20388 | | 3/1994 | |
| JP | 6-53578 | | 7/1994 | |
| JP | 06053578 | U1 | 7/1994 | |
| JP | 06053835 | U1 | 7/1994 | |
| JP | H06053578 | U1 | 7/1994 | |
| JP | H 0661487 | | 8/1994 | |
| JP | 2548081 | | 5/1997 | |
| JP | 9-315521 | | 9/1997 | |
| JP | 10-45213 | | 2/1998 | |
| JP | 10-045213 | | 2/1998 | |
| JP | A 10-045213 | | 2/1998 | |
| JP | H10045213 | | 2/1998 | |
| JP | H10250835 | U1 | 9/1998 | |
| JP | 11-016981 | | 1/1999 | |
| JP | 11100120 | A * | 4/1999 | ............. B65G 49/00 |
| JP | H11180505 | | 7/1999 | |
| JP | 2000-053237 | | 2/2000 | |
| JP | 2000-53237 | | 2/2000 | |
| JP | 2000053237 | | 2/2000 | |
| JP | 2000-150622 | | 5/2000 | |
| JP | 2000-161457 | | 6/2000 | |
| JP | 2000-188316 | | 7/2000 | |
| JP | 2000-255710 | | 9/2000 | |
| JP | 2000-289975 | | 10/2000 | |
| JP | 2001-31216 | | 2/2001 | |
| JP | 2001-031216 | | 2/2001 | |
| JP | 2001-093957 | | 4/2001 | |
| JP | 2001-144169 | | 5/2001 | |
| JP | 2001-158506 | A * | 6/2001 | |
| JP | 2001-171970 | A | 6/2001 | |
| JP | 2001-171970 | A * | 6/2001 | |
| JP | 2001-242978 | | 9/2001 | |
| JP | 2001354302 | | 12/2001 | |
| JP | 2004-512692 | | 4/2004 | |
| JP | 4626302 | B | 2/2011 | |
| JP | 2011-115010 | | 6/2011 | |
| JP | 2011-231707 | | 11/2011 | |
| JP | 4831521 | B | 12/2011 | |
| JP | 2014-003564 | | 1/2014 | |
| JP | 05-435414 | | 3/2014 | |
| SE | 524799 | | 10/2004 | |
| SU | 1326512 | A1 | 3/1986 | |
| WO | WO 98/46503 | | 10/1998 | |
| WO | WO 1998/46503 | | 10/1998 | |
| WO | WO 99/02436 | | 1/1999 | |
| WO | WO 1999/02436 | | 1/1999 | |
| WO | 99/13495 | A2 * | 3/1999 | |
| WO | WO 00/33355 | | 6/2000 | |
| WO | WO 00/37338 | | 6/2000 | |
| WO | WO 2000/37338 | | 6/2000 | |
| WO | WO 01/13408 | | 2/2001 | |
| WO | WO 2001/13408 | | 2/2001 | |
| WO | WO 2001/55805 | | 8/2001 | |
| WO | WO 01/96884 | | 12/2001 | |
| WO | WO 2001/96884 | | 12/2001 | |
| WO | 2002035583 | | 5/2002 | |
| WO | WO 2002/035583 | | 5/2002 | |
| WO | WO2002035583 | | 5/2002 | |

OTHER PUBLICATIONS

JP 2000255710 Machine Translation (Year: 2000).*
Kaempf, "Automated Wafer Transport in the Wafer Fab," *IEEE/ SEMI Advanced Semiconductor Manufacturing Conference*, pp. 356-361.
Office Action for application No. 2004-543686, dated Jul. 20, 2010, Japan.
Search Report from corresponding EP Application No./Patent No. 03776281.2-2222 / 1573778 PCT/US0332200, dated Sep. 13, 2011.
Description of Evidence (2), *Murata Machinery, LTD. V. Daifuku Co., Ltd.*, Invalidity No. 2012- 800048, Jan. 16, 2015 (2 pages).
Plaintiff Preliminary Statement (1), *Murata Machinery, LTD. V. Daifuku Co., Ltd.*, Japanese Patent No. 4831521, Jan. 16, 2015 (65 pages).
Plaintiff Preliminary Statement (2), *Murata Machinery, LTD. V. Daifuku Co., Ltd.*, Jan. 27, 2015 (2 pages).
Written Reply, *Murata Machinery, LTD. V. Daifuku Co., Ltd.*, Invalidity No. 2013-800061, Jan. 8, 2015 (2 pages).
The 2$^{nd}$ Preliminary Statement of a Defendant, *Murata Machinery, Ltd. V Daifuku Co., Ltd.*, Japanese Patent No. 4831521, No. 10253, Jun. 18, 2015 (12 pages).
Court Decision, *Murata Machinery, Ltd. vs Patent Office Commissioner Hitoshi Ito*, Certified in State of New York, Judgement Rendered May 27, 2015, Court Clerk 2014 (Gyo-Ke) No. 10149, Case of Request to Overturn Trial Decision, Appeal Case No. 2013-7294 (114 pages).
Court Decision, *Murata Machinery, Ltd. vs Patent Office Commissioner Hitoshi Ito*, Certified in State of New York, Judgement Rendered May 27, 2015, Court Clerk 2014 (Gyo-Ke) No. 10150, Case of Request to Overturn Trial Decision, Appeal Case No. 2013-7295 (92 pages).
Judgment, *Murata Machinery, Ltd. vs Daifuku Co., Ltd.*, Certified in State of New York, Rendition of Judgment Jul. 9, 2015, Court Clerk 2014, (Gyo Ke) No. 10253, Request to annul trial decision, Japanese Patent No. 4831521 (150 pages).
Non Final Office action issued in U.S. Appl. No. 14/788,464 dated Aug. 17, 2015.
An oral proceeding statement point document (2), Invalidity No. 2012-800047, patent No. 4626302, Aug. 2012 (6 pages).
Appeal case written reply, Invalidity No. 2012-800047, patent No. 4626302, Jul. 2012 (18 pages).
Guidance by a facsimile, sending of an oral proceeding advance memo, Invalidity No. 2012-800047, patent No. 4626302, Aug. 2012 (4 pages).
Guidance by a facsimile, about sending of oral proceeding minutes, Invalidity No. 2012-800047, patent No. 4626302, Sep. 2012 (5 pages).
Notification of acceptance of power of attorney, Invalidity No. 2012-800047, patent No. 4626302, May 2012 (2 pages).
Oral proceeding statement point document (2), Invalidity No. 2012-800047, patent No. 4626302, Aug. 2012 (8 pages).

(56) References Cited

OTHER PUBLICATIONS

Oral proceeding statement point document (3), Invalidity no. 2012-800047, patent No. 4626302, Aug. 2012 (4 pages).
Oral proceeding statement point document, Invalidity No. 2012-800047, U.S. Pat. No. 4626302, Aug. 2012 (14 pp.).
Oral proceeding statement point document (3.1), Invalidity No. 2012-800047, patent No. 4626302, Aug. 2012 (4 pages).
The transmission notice of a bill duplicate, Invalidity No. 2012-800047, patent No. 4626302, May 2012 (64 pages).
Trial decision, Invalidity No. 2012-800047, Invalidity No. 2012-800047, patent No. 4626302, 2012 (51 pages).
Trial matter notice, Invalidity No. 2012-800047, patent No. 4626302, Jul. 2012 (8 pages).
Trial matter notice (2), Invalidity No. 2012-800047, patent No. 4626302, Aug. 2012 (9 pages).
Written amendment, Invalidity No. 2012-800047, patent No. 4626302, Apr. 2012 (2 pages).
A preliminary announcement of a trial decision, Invalidity 2013-800061, 2013 (43 pages).
An oral proceeding statement point document—the notice of sending of a duplicate, Invalidity 2013-800061, patent No. 4831521, Dec. 2013 (6 pages).
Appeal case written reply, Invalidity 2013-800061, patent No. 4831521, Jul. 2013 (22 pages).
Demand for correction document, Invalidity 2013-800061, patent No. 4831521, Jul. 2013 (20 pages).
Guidance of a facsimile, Invalidity 2013-800061, patent No. 4831521, Dec. 2013 (4 pages).
Oral proceeding statement point document, Invalidity No. 2013-800061, patent No. 4831521, Dec. 2013 (16 pages).
The notice of sending of a written refutation duplicate, Invalidity No. 2013-800061, patent No. 4831521, Nov. 11, 2013 (25 pages).
The transmission notice of a bill duplicate, Invalidity No. 2013-800061, patent No. 4831521, May 2013 (46 pages).
Trial matter notice, Invalidity No. 2013-800061, patent No. 4831521, Nov. 2013 (4 pages).
Written Amendment (method), Invalidity No. 2013-800061, patent No. 4831521, Jul. 2013 (3 pages).
Written Statement, Invalidity No. 2013-800061, patent No. 4831521, Jan. 2013 (5 pages).
Written Statement, Invalidity No. 2013-800061, patent No. 4831521, Dec. 2013 (15 pages).
Demand for correction document, Invalidity No. 2013-800061, patent No. 4831521, May 2013 (33 pages).
An oral proceeding statement point document—the notice of sending of a duplicate, Invalidity No. 2012-800048, patent No. 4831521, Aug. 2012 (9 pages).
Appeal case written reply, Invalidity No. 2012-800048, patent No. 4831521, Jul. 2013 (19 pages).
Guidance by a facsimile, about sending of an oral proceeding advance memo, Invalidity No. 2012-800048, patent No. 4831521, Aug. 2012 (5 pages).
Guidance by a facsimile, about sending of oral proceeding minutes, Invalidity No. 2012-800048, patent No. 4831521, Sep. 2012 (5 pages).
Notification of acceptance of power of attorney, Invalidity No. 2012-800048, patent No. 4831521, May 2012 (3 pages).
Oral proceeding statement point document, Invalidity No. 2012-800048, patent No. 4831521, Aug. 2012 (7 pages).
Oral proceeding statement point document (2), Invalidity No. 2012-800048, patent No. 4831521, Aug. 2012 (13 pages).
Oral proceeding statement point document (2.1), Invalidity No. 2012-800048, patent No. 4831521, Aug. 2012 (7 pages).
Oral proceeding statement point document (3), Invalidity No. 2012-800048, patent No. 4831521, Aug. 2012 (6 pages).
Oral proceeding statement point document (3.1), Invalidity No. 2012-800048, patent No. 4831521, Aug. 2012 (3 pages).
The transmission notice of a bill duplicate, Invalidity No. 2012-800048, patent No. 4831521, May 2012 (36 pages).
Trial decision, Invalidity No. 2012-800048, patent No. 4831521, 2012 (34 pages).
Trial matter notice, Invalidity No. 2012-800048, patent No. 4831521, Jul. 2012 (5 pages).
Trial matter notice, Invalidity No. 2012-800048, patent No. 4831521, Aug. 2012 (5 pages).
Written amendment, Invalidity No. 2012-800048, patent No. 4831521, Apr. 2012 (2 pages).
European Communication dated Jul. 16, 2014 from European application No. 03761012.8 (5 pages).
English Translation of Japanese office action from Japanese application No. 2011-115010 dated Nov. 11, 2013 (7 pages).
English Translation of Japanese office action from Japanese application No. 2011-231707 dated Nov. 11, 2013 (6 pages).
Office Action dated Dec. 29, 2004, for U.S. Appl. No. 10/393,526.
Response to Office Action dated Dec. 29, 2004, filed Mar. 28, 2005 for U.S. Appl. No. 10/393,526.
Final Office Action dated Jul. 5, 2005, for U.S. Appl. No. 10/393,526.
Response to Office Action dated Jul. 5, 2005, filed Sep. 1, 2005 for U.S. Appl. No. 10/393,526.
Non-Final Office Action dated May 9, 2006, for U.S. Appl. No. 10/393,526.
Response to Office Action dated May 9, 2006, filed Aug. 9, 2006 for U.S. Appl. No. 10/393,526.
Non-Final Office Action dated Apr. 24, 2007, for U.S. Appl. No. 11/652,707.
Response to Office Action dated Apr. 24, 2007, filed Aug. 16, 2007 for U.S. Appl. No. 11/652,707.
Non-Final Office Action dated Oct. 19, 2007, for U.S. Appl. No. 11/652,707.
Response to Office Action dated Oct. 19, 2007, filed Jan. 17, 2008 for U.S. Appl. No. 11/652,707.
Final Office Action dated May 2, 2008, for U.S. Appl. No. 11/652,707.
Response to Office Action dated May 2, 2008, filed Aug. 1, 2008 for U.S. Appl. No. 11/652,707.
Response to Office Action dated May 2, 2008, filed Apr. 3, 2009 for U.S. Appl. No. 11/652,707.
Non-Final Office Action dated Jun. 22, 2009, for U.S. Appl. No. 11/652,707.
Response to Office Action dated Jun. 22, 2009, filed Sep. 22, 2009 for U.S. Appl. No. 11/652,707.
Non-Final Office Action dated Nov. 3, 2011, for U.S. Appl. No. 12/724,194.
Response to Office Action dated Nov. 3, 2011, filed Feb. 3, 2012 for U.S. Appl. No. 12/724,194.
Campbell, "Overhead Intrabay Automation and Microstocking—a virtual fab case study," *IEEE/SEMI Advance dSemiconductor Manufacturing Conference*, pp. 368-372 (1997).
Kaempf, "Automated Wafer Transport in the Wafer Fab," *IEEE/SEMI Advanced Semiconductor Manufacturing Conference*, pp. 356-361 (1997).
Kuo, "Modelling and Performance Evaluation of an Overhead Hoist Trasnport System in a 300 mm Fabrication Plant," *Int. J. Adv. Manuf. Technol.*, vol. 20, pp. 153-161 (2002).
Sikich, "Development and Implementation of an Automated Wafer Transport System," *IEEE/SEMI Advanced Semiconductor Manufacturing Conference*, pp. 400-404 (1998).
Office Action from Patent Application No. JP 2004-515615, dated Mar. 22, 2011.
Judgement, *Murata Machinery, Ltd. V Daifuku Co., Ltd.*, Japanese Patent No. 4831521, No. 10253, Invalidity No. 800061, Jun. 25, 2015 (57 pages).
Non Final Office action issued in U.S. Appl. No. 13/492,341 dated Sep. 10, 2015.
Non Final Office action issued in U.S. Appl. No. 14/755,928 dated Oct. 16, 2015.
Non Final Office action issued in U.S. Appl. No. 14/788,173 dated Oct. 15, 2015.
Non Final Office action issued in U.S. Appl. No. 14/080,590 dated Sep. 23, 2015.

(56) References Cited

OTHER PUBLICATIONS

USPTO, Patent Trial and Appeal Board, *Daifuku Co., LTD and Daifuku America Corp.*, Petitioner, v. *Murata Machinery, LTD.*, Patent Owner, Case IPR2015-00087, U.S. Pat. No. 7,165,927, Oct. 17, 2014 (664 pages).
USPTO, Patent Trial and Appeal Board, *Daifuku Co., LTD and Daifuku America Corp.*, Petitioner, v. *Murata Machinery, LTD.*, Patent Owner, Case IPR2015-00088, U.S. Pat. No. 7,165,927, Oct. 17, 2014 (671 pages).
USPTO, Patent Trial and Appeal Board, *Daifuku Co., LTD and Daifuku America Corp.*, Petitioner, v. *Murata Machinery, LTD.*, Patent Owner, Case IPR2015-00085, U.S. Pat. No. 7,771,153, Oct. 17, 2014 (643 pages).
USPTO, Patent Trial and Appeal Board, *Daifuku Co., LTD and Daifuku America Corp.*, Petitioner, v. *Murata Machinery, LTD.*, Patent Owner, Case IPR2015-00084, U.S. Pat. No. 7,771,153, Oct. 17, 2014 (632 pages).
USPTO, Patent Trial and Appeal Board, *Daifuku Co., LTD and Daifuku America Corp.*, Petitioner, v. *Murata Machinery, LTD.*, Patent Owner, Case IPR2015-00083, U.S. Pat. No. 8,197,172, Oct. 17, 2014 (642 pages).
Complaint filed Sep. 23, 2013; *Murata Machinery USA, Inc. et al. v Daifuku Co., Ltd. Et al.*, No. 2:13-cv-00866, D. Utah Sep. 23, 2013 (9 pages).
Dictionary.com, retrieved from the Internet, http://dictionary.reference.com/browse/translate?s=t[Oct. 8, 2014 2:45:57 PM], visited Oct. 8, 2014 (8 pages).
Amendment dated Aug. 9, 2006, U.S. Appl. No. 10/393,526 (31 pages).
Notice of Allowance and Notice of Allowability dated Oct. 26, 2006, U.S. Appl. No. 10/393,526 (6 pages).
Office Action dated Nov. 3, 2011, U.S. Appl. No. 12/724,194 (6 pages).
Amendment dated Feb. 3, 2012, U.S. Appl. No. 12/724,194 (18 pages).
Notice of Allowance and Notice of Allowability dated Feb. 28, 2012, U.S. Appl. No. 12/724,194 (9 pages).
Preliminary Amendment dated Mar. 15, 2010, U.S. Appl. No. 12/724,194 (8 pages).
Original Application Claim 1 Dated Jan. 12, 2007, U.S. Appl. No. 11/652,707 (34 pages).
Amendment dated Apr. 3, 2009, U.S. Appl. No. 11/652,707 (14 pages).
Amendment dated Sep. 22, 2009, U.S. Appl. No. 11/652,707 (13 pages).
Office Action dated Jun. 22, 2009, U.S. Appl. No. 11/652,707 (6 pages).
Notice of Allowance and Notice of Allowability dated Nov. 18, 2009, U.S. Appl. No. 11/652,707 (6 pages).
Notice of Allowance and Notice of Allowability dated May 5, 2010, U.S. Appl. No. 11/652,707 (6 pages).
Declaration of Dr. Robert Sturges Regarding Patentability of U.S. Pat. No. 7,165,927, Oct. 14, 2014 (146 pages).
Notification of conclusion of appeal examination document, Invalidity 2013-800061, Patent No. 4831521, Intellectual Property High Court of Japan, Oct. 2, 2014 (17 pages).
Trial Decision, Invalidity 2013-800061, Patent No. 4831521, Intellectual Property High Court of Japan, Oct. 23, 2014 (35 pages).
Complaint, Invalidity 2013-800061, Patent No. 4831521, Intellectual Property High Court of Japan, Nov. 19, 2014 (5 pages).
USPTO Non Final Office Action in U.S. Appl. No. 10/682,809, dated Jun. 4, 2015, 10 pages.
Description of Evidence (3), *Murata Machinery, LTD.* V. *Daifuku Co., Ltd.*, Invalidity No. 2012-800048, Apr. 1, 2015 (2 pages).
Description of Evidence (4), *Murata Machinery, LTD.* V. *Daifuku Co., Ltd.*, Invalidity No. 2012-800048, Japanese Patent No. 48315241, May 28, 2015 (2 pages).
Judgment, The shell No. 25 certificate, *Murata Machinery, LTD.* V. *Daifuku Co., Ltd.*, Invalidity No. 2012-800048, May 27, 2015 (56 pages).
Judgment, The shell No. 26 certificate, *Murata Machinery, LTD.* V. *Daifuku Co., Ltd.*, Invalidity No. 2012-800048, May 27, 2015 (46 pages).
Plaintiff Preliminary Statement (3), *Murata Machinery, LTD.* V. *Daifuku Co., Ltd.*, Apr. 1, 2015 (34 pages).
The 1$^{st}$ Preliminary Statement of a defendant, *Murata Machinery, LTD.* V. *Daifuku Co., Ltd.*, Mar. 2, 2015 (33 pages).
Decision Denying Institution of Inter Partes Review 37 C.F.R. §42.108, *Murata Machinery, LTD.* V. *Daifuku Co., Ltd.*, May 4, 2015 (18 pages).
Description of Evidence (5), *Murata Machinery, LTD.* V. *Daifuku Co., Ltd.*, Invalidity No. 2012-800048, Japanese Patent No. 48315241, Jun. 10, 2015 (2 pages).
Technical Explanation Data, Evidence No. 27, *Murata Machinery, LTD.* V. *Daifuku Co., Ltd.*, Invalidity No. 2012-800048, Japanese Patent No. 48315241, Jun. 10, 2015 (12 pages).
Written Statement, *Murata Machinery, LTD.* V. *Daifuku Co., Ltd.*, Invalidity No. 2012-800048, Japanese Patent No. 48315241, Jun. 10, 2015 (1 page).
The Trial Decision, *Murata Machinery, Ltd.* V *Daifuku Co., Ltd.*, Dispatch No. 105297, Invalidity 2013-800061, Japanese Patent No. 4831521, No. 10253, Jan. 7, 2016 (42 pages).
European Communication issued in European application 13162984.2 dated Feb. 2, 2015 (24 pages).
Final Written Decision, *Daifuku Co., Ltd. and Daifuku America Corp.* v *Murata Machinery, Ltd.*, Case IPR2015-00088, U.S. Pat. No. 7,165,927B2, May 3, 2016 (27 pages).
Decision: Final Written Decision, *Daifuku Co., Ltd. and Daifuku America Corp.* v *Murata Machinery, Ltd.*, Case IPR2015-00085, U.S. Pat. No. 7,771,153B2, May 3, 2016 (32 pages).
Record of Oral Hearing, *Daifuku Co., Ltd. and Daifuku America Corp.* v *Murata Machinery, Ltd.*, Case No. IPR2015-00083 (U.S. Pat. No. 8,197,172), Case No. IPR2015-00085 (U.S. Pat. No. 7,771,153), Case No. IPR2015-00088 (U.S. Pat. No. 7,165,927), Mar. 8, 2016 (90 pages).
Non Final office action from U.S. Appl. No. 14/755,928 dated Apr. 13, 2016.
Final office action from U.S. Appl. No. 14/080,590 dated Apr. 27, 2016.
Notice of allowance from U.S. Appl. No. 14/788,173 dated Apr. 19, 2016.
Final office action from U.S. Appl. No. 14/788,464 dated Feb. 18, 2016.
Non Final office action from U.S. Appl. No. 13/492,341 dated Mar. 9, 2016.
Notice of allowance from U.S. Appl. No. 14/788,173 dated Aug. 24, 2016.
Final office action from U.S. Appl. No. 13/492,341 dated Aug. 26, 2016.
European communication from EP Application No. 03761012.8 dated Jul. 24, 2017 (5 pages).

\* cited by examiner

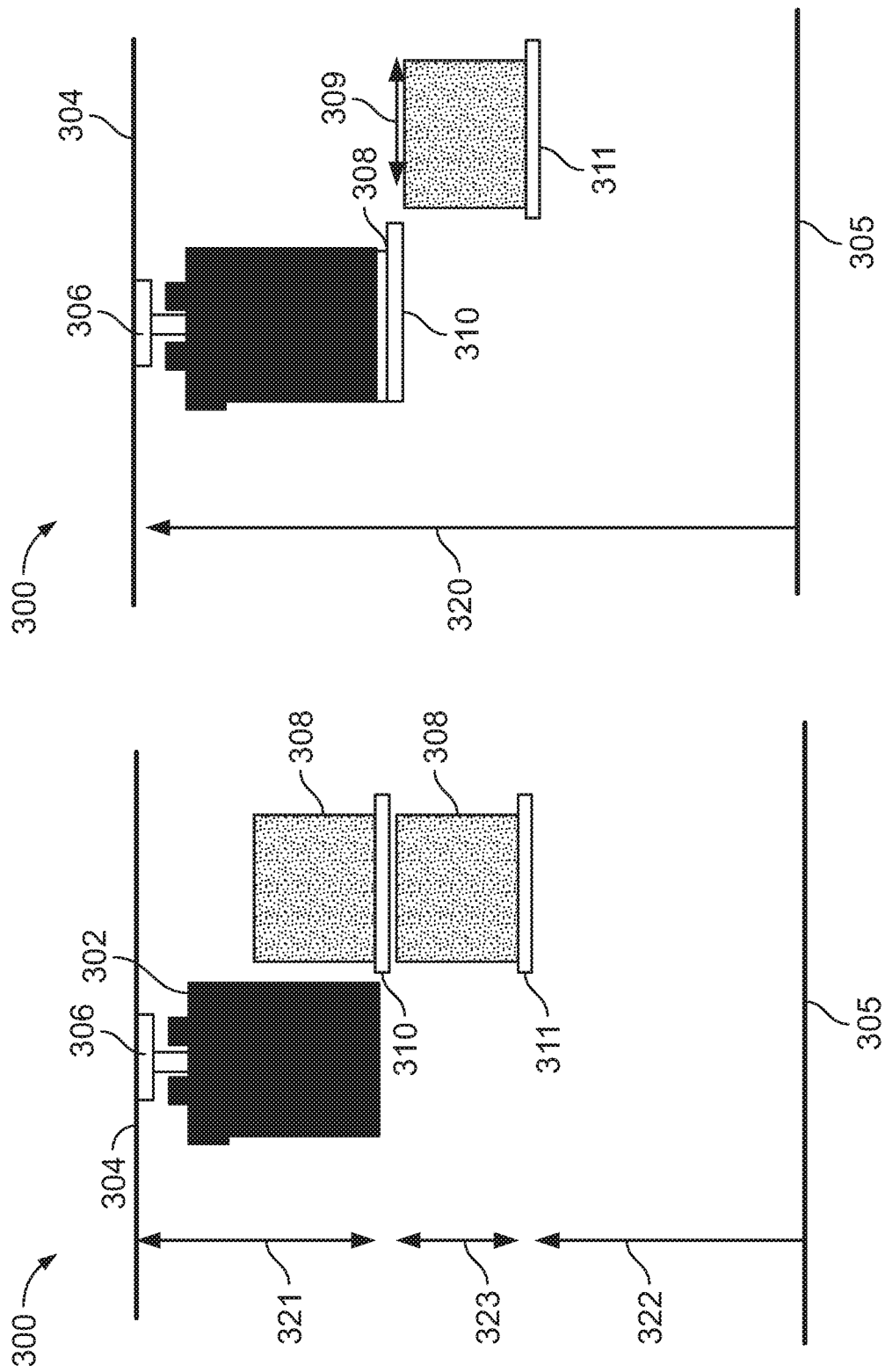

ACCESS TO ONE OR MORE LEVELS OF MATERIAL STORAGE SHELVES BY AN OVERHEAD HOIST TRANSPORT VEHICLE FROM A SINGLE TRACK POSITION

CROSS REFERENCE TO RELATED APPLICATIONS

This application claims priority of U.S. Provisional Patent Application No. 60/417,993 filed Oct. 11, 2002 entitled OFFSET ZERO FOOTPRINT STORAGE (ZFS) USING MOVING SHELVES OR A TRANSLATING HOIST PLATFORM.

STATEMENT REGARDING FEDERALLY SPONSORED RESEARCH OR DEVELOPMENT

N/A

BACKGROUND OF THE INVENTION

The present application relates generally to automated material handling systems, and more specifically to an automated material handling system that allows an overhead hoist on a suspended track to access Work-In-Process (WIP) parts stored beside the track.

Automated material handling systems are known that employ WIP storage units and overhead hoists to store WIP parts and to transport them between workstations and/or processing machines in a product manufacturing environment. For example, such an automated material handling system may be employed in the fabrication of Integrated Circuit (IC) chips. A typical process of fabricating IC chips includes various processing steps such as deposition, cleaning, ion implantation, etching, and passivation steps. Each of these steps in the IC chip fabrication process may be performed by a different processing machine such as a chemical vapor deposition chamber, an ion implantation chamber, or an etcher. Further, the WIP parts, in this case, semiconductor wafers, are typically transported between the different workstations and/or processing machines multiple times to perform the various steps required for fabricating the IC chips.

A conventional automated material handling system used in an IC chip fabrication process comprises a plurality of WIP storage units for storing semiconductor wafers, and one or more transport vehicles including respective overhead hoists for moving the wafers between workstations and processing machines on the IC chip manufacturing floor. The semiconductor wafers stored in the WIP storage units are typically loaded into carriers such as Front Opening Unified Pods (FOUPs), each of which may be selectively accessed via an overhead hoist carried by a respective overhead hoist transport vehicle traveling on a suspended track. In a typical system configuration, the FOUPs are stored in WIP storage units located underneath the track. Accordingly, the overhead hoist transport vehicle is typically moved along the suspended track to a position directly above a selected FOUP, and the overhead hoist is lowered toward the FOUP and operated to pick the FOUP from the WIP storage unit or to place a FOUP to the WIP storage unit.

One drawback of the above-described conventional automated material handling system is that the overhead hoist is capable of accessing just a single level of WIP storage underneath the suspended track. This is problematic because providing only one level of WIP storage on the product manufacturing floor can increase costs due to the inefficient use of floor space. In order to access multiple levels of WIP storage beneath the track, the WIP storage unit must be configured to move a selected FOUP from its current position in the storage unit to a position at the level accessible to the overhead hoist. However, requiring the WIP storage unit to move the selected FOUP to the level beneath the track that is accessible to the overhead hoist can significantly lower the throughput of the material handling system. Further, such a WIP storage unit typically has many moving parts such as rollers, bearings, and motors that are subject to failure, which not only increases costs but also diminishes the reliability of the overall system.

Moreover, because overhead hoists included in conventional automated material handling systems access WIP parts from storage units located underneath a suspended track, a minimum amount of space is typically required between the ceiling and floor of the product manufacturing facility to accommodate the track and the overhead hoist transport vehicles. This further limits the amount of space in the manufacturing facility that might otherwise be used for storing WIP parts. In addition, because only one level of WIP storage is accessible to each overhead hoist, multiple overhead hoists must normally queue up at a WIP storage unit to access WIP parts from that storage unit, thereby further lowering system throughput.

It would therefore be desirable to have an automated material handling system that provides enhanced material handling efficiency while overcoming the drawbacks of conventional automated material handling systems.

BRIEF SUMMARY OF THE INVENTION

In accordance with the present invention, an improved automated material handling system is provided that allows an overhead hoist supported by a suspended track to access Work-In-Process (WIP) parts from storage locations beside the track. By allowing overhead hoists to access WIP parts stored beside the track, the presently disclosed automated material handling system makes more efficient use of space, and provides higher throughput, enhanced reliability, and reduced costs.

In a first embodiment, the improved automated material handling system includes at least one overhead hoist transport vehicle for transporting an overhead hoist on a suspended track, and a plurality of storage bins for storing WIP parts located beside the track. The plurality of storage bins is configured to allow the overhead hoist to access one or more WIP parts directly from a selected one of the storage bins. In this first embodiment, each storage bin comprises a movable shelf. The plurality of movable shelves may be disposed in a single row or in multiple rows beside and substantially parallel to the track. Further, one or more rows of movable shelves may be located on either side or on both sides of the suspended track. To access one or more WIP parts from a selected shelf, the overhead hoist transport vehicle carrying the overhead hoist moves along the suspended track to a position at the side of the selected shelf. Next, the selected shelf moves to a position directly underneath the overhead hoist. The overhead hoist is then operated to pick a desired WIP part directly from the shelf, or to place one or more WIP parts directly to the shelf. In the preferred embodiment, because the overhead hoist is not required to pass over the desired WIP part, the selected shelf may be at substantially the same height as the overhead hoist. In this case, the WIP part passes through a cowl opening in the overhead hoist transport vehicle as the shelf moves to the position underneath the overhead hoist. Once the WIP part is held by the overhead hoist, the shelf moves back to its original position in the row of shelves.

In the event the automated material handling system includes multiple rows of movable shelves, each row of shelves is substantially directly above or below an adjacent row of shelves, thereby forming at least one shelf array including multiple rows and multiple columns of movable shelves. The top row of shelves in the shelf array may be at substantially the same height as the overhead hoist. To access one or more WIP parts from a selected shelf in the top row of shelves, the overhead hoist transport vehicle carrying the overhead hoist moves along the suspended track to a position at the side of the selected shelf, the selected shelf moves to a position directly underneath the overhead hoist, and the overhead hoist picks a desired WIP part directly from the shelf or places one or more WIP parts directly to the shelf. The selected shelf then moves back to its original position in the shelf array.

To access WIP parts from a selected shelf in a row below the top row of shelves, the overhead hoist transport vehicle moves along the suspended track to a position at the side of the column including the selected shelf. Next, the selected shelf moves to a position directly underneath the overhead hoist, which is subsequently lowered toward the shelf to pick a desired WIP part directly from the shelf or to place one or more WIP parts directly to the shelf. The overhead hoist may then access WIP parts on different shelves in the same column of shelves from the same position on the suspended track. Alternatively, the overhead hoist may move to a position on the track adjacent a different column of shelves, and access WIP parts on one or more shelves in that column. Once the desired WIP part is held by the overhead hoist, the selected shelf moves back to its original position in the shelf array.

In a second embodiment, the improved automated material handling system includes at least one overhead hoist transport vehicle for transporting an overhead hoist along a suspended track and a plurality of WIP storage bins located beside the track, in which each storage bin comprises a passive or fixed shelf. In this second embodiment, the overhead hoist is mounted on a translating stage configured to move the hoist to a position substantially directly above a selected one of the fixed shelves. The plurality of fixed shelves may be disposed in a single row or in multiple rows beside and substantially parallel to the track. Moreover, one or more rows of fixed shelves may be located on either side or on both sides of the track. To access one or more WIP parts from the selected fixed shelf, the overhead hoist transport vehicle moves along the suspended track to a position at the side of the selected shelf. Next, the translating stage moves the overhead hoist from a first position within the overhead hoist transport vehicle to a second position directly above the selected shelf. The overhead hoist is then operated to pick a desired WIP part directly from the shelf, or to place one or more WIP parts directly to the shelf. The selected shelf may be at substantially the same height as the overhead hoist. Once the WIP part is held by the overhead hoist, the translating stage moves the overhead hoist from the position above the shelf back to its original position within the overhead hoist transport vehicle.

In the preferred embodiment, the plurality of storage bins for storing WIP parts is suspended above the floor of the product manufacturing facility. For example, the plurality of storage bins may be suspended from the track structure, suspended from the ceiling of the product manufacturing facility, supported from the wall of the product manufacturing facility, or supported from the floor of the manufacturing facility. Because the storage bins are suspended on either side or on both sides of the track, the plurality of suspended storage bins provides offset Zero Footprint Storage (ZFS) for the WIP parts, which leads to more efficient usage of space in the product manufacturing facility.

By configuring overhead hoist mechanisms and WIP storage bins to allow overhead hoists supported by suspended tracks to access WIP parts stored beside the tracks, an improved automated material handling system can be achieved that makes more efficient use of space, and provides higher throughput, enhanced reliability, and reduced costs.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIGS. 3a-3b are block diagrams of the first embodiment of offset zero footprint storage of FIG. 2, in which the offset zero footprint storage comprises multiple rows of movable shelves;

DETAILED DESCRIPTION OF THE INVENTION

U.S. Provisional Patent Application No. 60/417,993 filed Oct. 11, 2002 entitled OFFSET ZERO FOOTPRINT STORAGE (ZFS) USING MOVING SHELVES OR A TRANSLATING HOIST PLATFORM is incorporated herein by reference.

An improved automated material handling system is disclosed that allows an overhead hoist mechanism supported by a suspended track to access Work-In-Process (WIP) parts from storage bins located beside the track. The presently disclosed automated material handling system makes more efficient use of space while providing higher throughput, enhanced reliability, and reduced costs. As may be realized, the overhead track may be configured so that it is capable of being disposed overhead substantially independent of an arrangement of objects on the floor.

Figure 1:
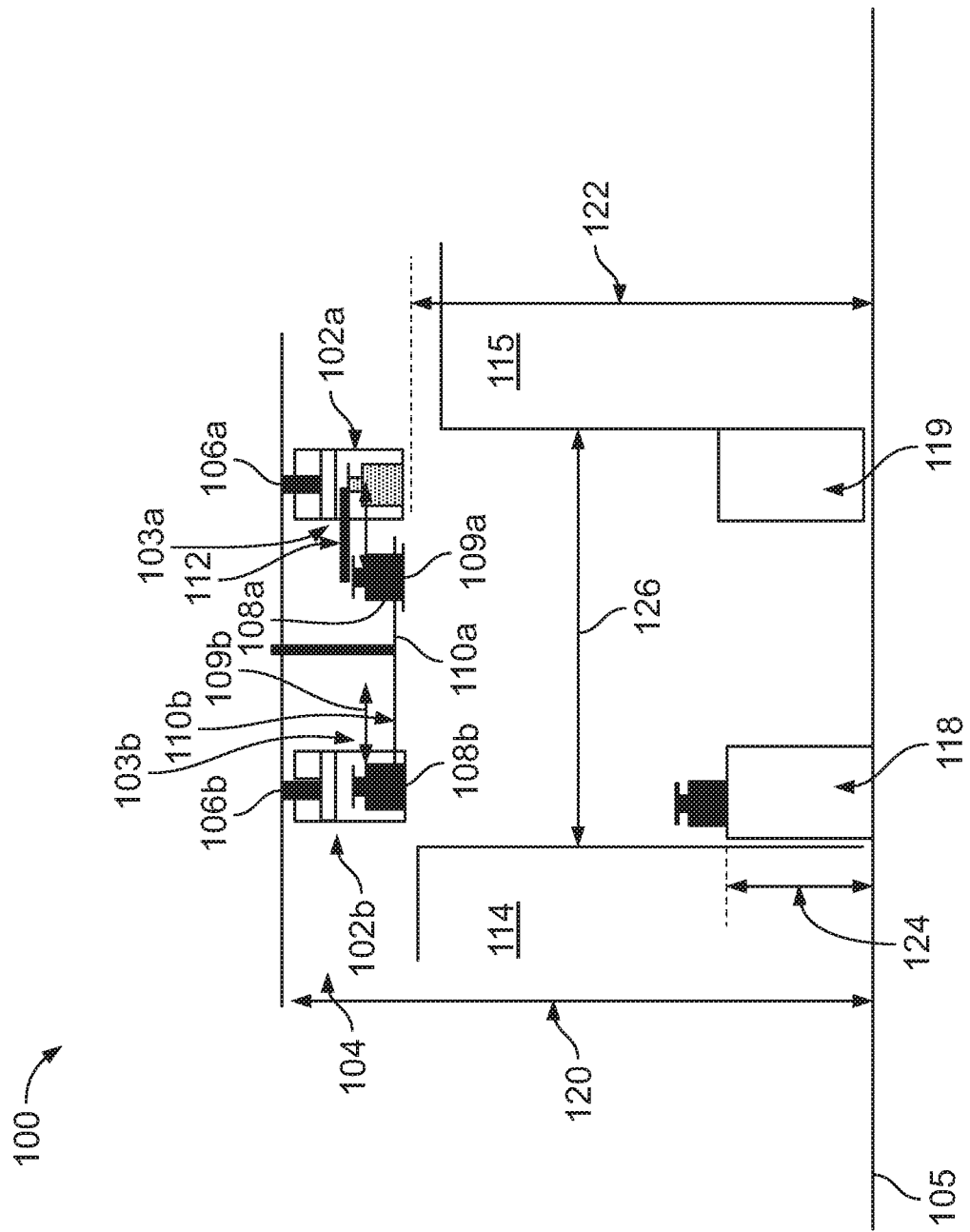
FIG. 1 is a block diagram of an IC chip manufacturing environment including an automated material handling system according to the present invention.

FIG. 1 depicts an illustrative embodiment of a product manufacturing environment 101 including an Automated Material Handling System (AMHS) 100, in accordance with the present invention. In the illustrated embodiment, the AMHS 100 is configured for automatically storing WIP parts and transporting them between various workstations and/or processing machines, e.g., processing machines 114-115 having input/output ports 118-119, respectively, within the product manufacturing environment 101.

It is noted that the AMHS 100 may be employed in a clean environment for manufacturing Integrated Circuit (IC) chips such as a 200 mm or 300 mm FAB plant, or any other suitable product manufacturing environment. As shown in FIG. 1, the IC chip manufacturing environment 101 includes a ceiling 104 and a floor 105, which is typically covered with an electrically nonconductive material and designed to meet specific loading and seismic requirements. Further, the processing machines 114-115 are configured to perform various processing steps for fabricating the IC chips. For example, the ceiling 104 may be located a distance 120 of about 3.5 m above the floor 105, the processing machines 114-115 may be spaced a distance 126 of at least about 1.9 m apart, and a top surface of the input/output ports 118-119 may be a distance 124 of about 0.9 m from the floor 105.

Figure 5:
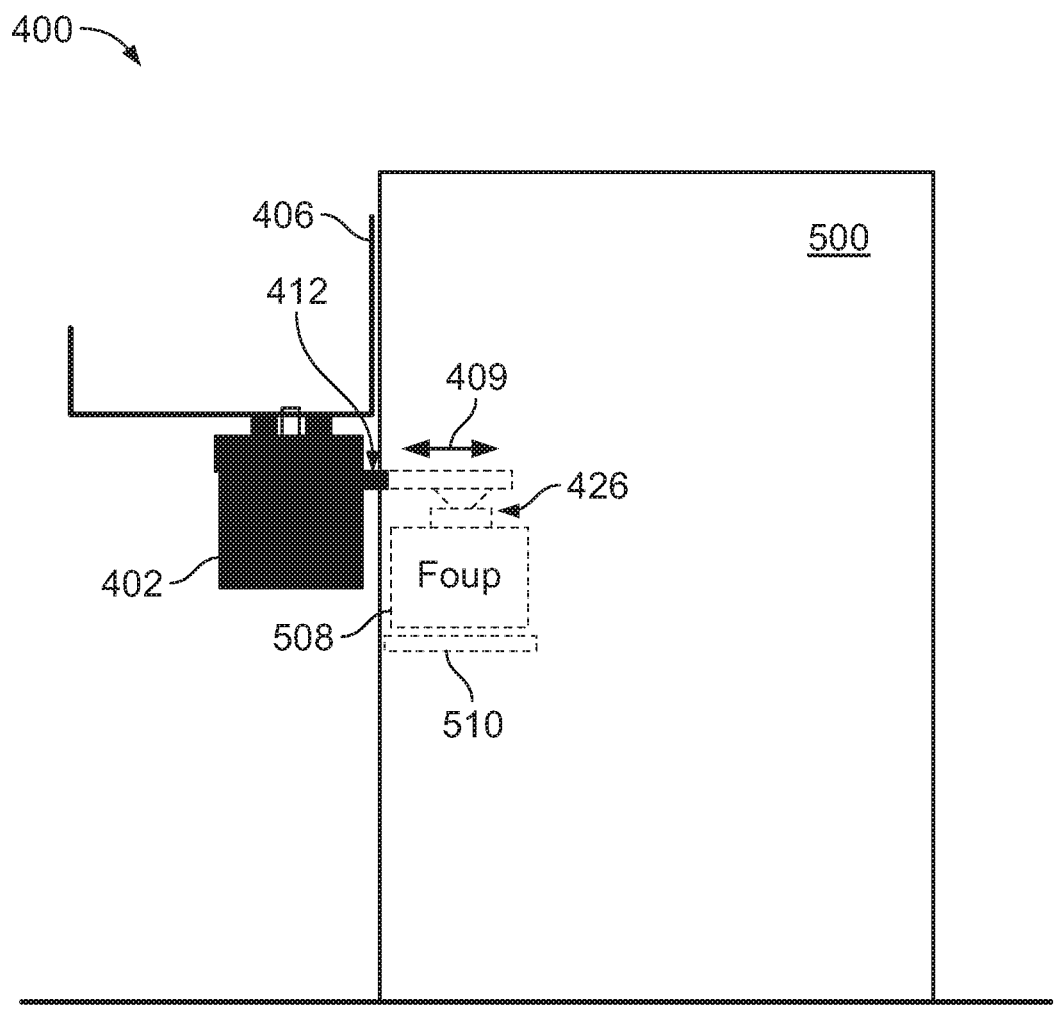
FIG. 5 is a block diagram of the overhead hoist mechanism of FIG. 4 employed in conjunction with a WIP storage unit.

In the illustrated embodiment, the AMHS 100 includes overhead hoist transport vehicles 102a-102b movably coupled to tracks 106a-106b, respectively, both of which are suspended from the ceiling 104. The overhead hoist transport vehicles 102a-102b are configured to move respective overhead hoists (see, e.g., an overhead hoist 425 including a hoist gripper 426, as depicted in FIG. 5) along the tracks 106a-106b for accessing carriers such as Front Opening Unified Pods (FOUPs) 108a-108b designed to hold WIP parts, i.e., semiconductor wafers. As shown in FIG. 1, the FOUPs 108a-108b are stored in storage bins such as shelves 110a-110b, respectively. Further, the suspended tracks 106a-106b define predetermined routes passing at the side of the shelves 110a-110b, respectively, thereby allowing the overhead hoist transport vehicles 102a-102b to access the FOUPs 108a-108b directly from the respective shelves 110a-110b. For example, the overhead hoist transport vehicles 102a-102b may be disposed a distance 122 of about 2.6 m above the floor 105.

Specifically, the shelf 110a is a passive or fixed shelf, which may be one of a number of fixed shelves disposed in a row beside and substantially parallel to the suspended track 106a. It should be understood that one or more rows of fixed shelves may be disposed on either side or on both sides of the track 106a. In the illustrated embodiment, to access the FOUP 108a from the fixed shelf 110a, the overhead hoist transport vehicle 102a moves along the suspended track 106a to a position at the side of the shelf 110a. Next, a translating stage 112 included in the overhead hoist transport vehicle 102a moves the overhead hoist laterally from a first position within the overhead hoist transport vehicle 102a to a second position substantially directly above the fixed shelf 110a, as indicated by directional arrows 109a. The overhead hoist is then operated to pick the FOUP 108a directly from the shelf 110a for subsequent transport to a workstation or processing machine on the IC chip manufacturing floor. It is understood that the overhead hoist may alternatively place one or more FOUPs to the shelf 110a. It is also noted that the translating stage 112 may be configured to allow the overhead hoist to pick/place a FOUP from/to either side of the overhead hoist transport vehicle 102a.

In the preferred embodiment, the fixed shelf 110a may be at substantially the same height above the floor 105 as the overhead hoist transport vehicle 102a. In this embodiment, the overhead hoist transport vehicle 102a includes a cowl 103a having an opening formed therethrough to allow the translating stage 112 to move from within the transport vehicle to its position above the fixed shelf 110a. After having picked the FOUP 108a from the shelf 110a, the FOUP 108a passes through the opening in the cowl 103a as the translating stage 112 is moved back to its original position within the overhead hoist transport vehicle 102a.

Whereas the shelf 110a comprises a fixed shelf, the shelf 110b is a movable shelf. Like the fixed shelf 110a, the movable shelf 110b may be one of a number of movable shelves disposed in a row beside and substantially parallel to the suspended track 106b. Further, one or more rows of movable shelves may be disposed on either side or on both sides of the track 106b. In the illustrated embodiment, to access the FOUP 108b on the movable shelf 110b, the overhead hoist transport vehicle 102b moves along the suspended track 106b to a position at the side of the shelf 110b. Next, the shelf 110b moves laterally from a first position beside the track 106b to a second position substantially directly underneath the overhead hoist within the overhead hoist transport vehicle 102b, as indicated by directional arrows 109b. For example, the movable shelf 110b may be provided with a mechanism for moving the shelf 110b along a pneumatically, stepper motor, or servo motor controlled axis between the first position beside the track 106b and the second position under the track and overhead hoist. The overhead hoist is then operated to pick the FOUP 108b directly from the shelf 110b for subsequent transport to a workstation or processing machine on the IC chip manufacturing floor. It is understood that the overhead hoist may alternatively place one or more FOUPs to the shelf 110b.

Like the fixed shelf 110a, the movable shelf 110b may be at substantially the same height above the floor 105 as the overhead hoist transport vehicle 102b. Further, the overhead hoist transport vehicle 102b includes a cowl 103b having an opening formed therethrough to allow the movable shelf 110b holding the FOUP 108b to move to its position below the overhead hoist within the transport vehicle 102b. Once the FOUP 108b is held by the overhead hoist, the shelf 110b moves back to its original position beside the suspended track 106b.

It should be appreciated that the automated material handling system described herein operates under computerized control. For example, the AMHS 100 may comprise a computer system including one or more processors for executing instructions out of a memory. The instructions executed in performing the operations herein described may comprise instructions stored as program code considered part of an operating system, instructions stored as program code considered part of an application, or instructions stored as program code allocated between the operating system and the application. Further, the memory may comprise Random Access Memory (RAM), a combination of RAM and Read Only Memory (ROM), or any other suitable program storage.

Figure 2A:
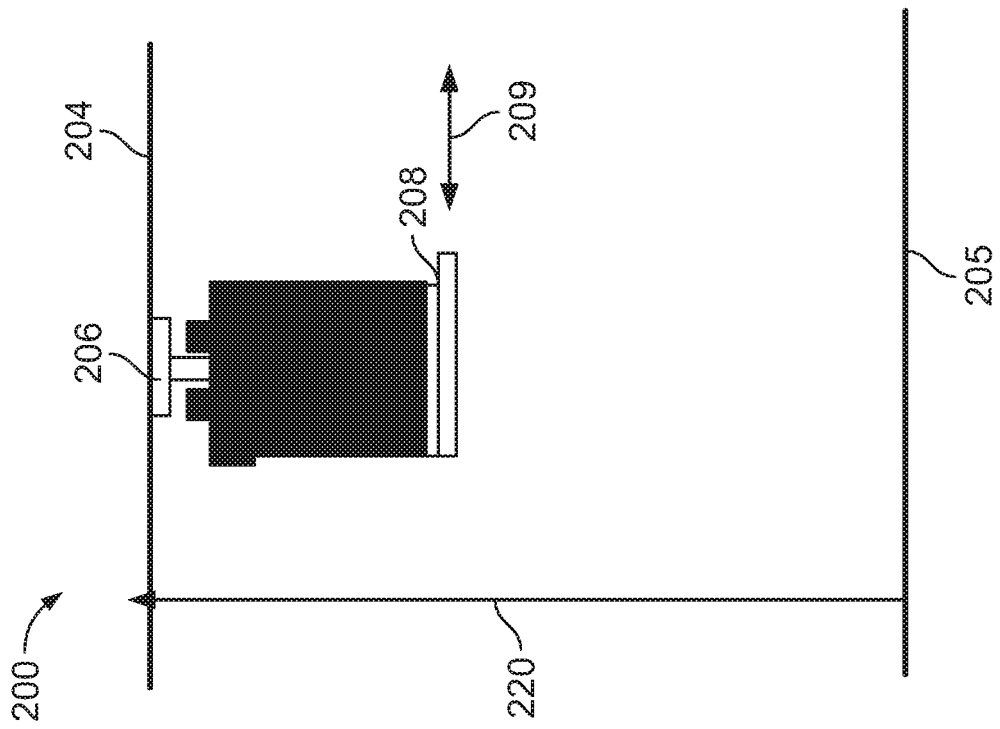
FIGS. 2a-2b are block diagrams of a first embodiment of offset zero footprint storage employed in the automated material handling system of FIG. 1, in which the offset zero footprint storage comprises a single row of movable shelves.
Figure 2B:
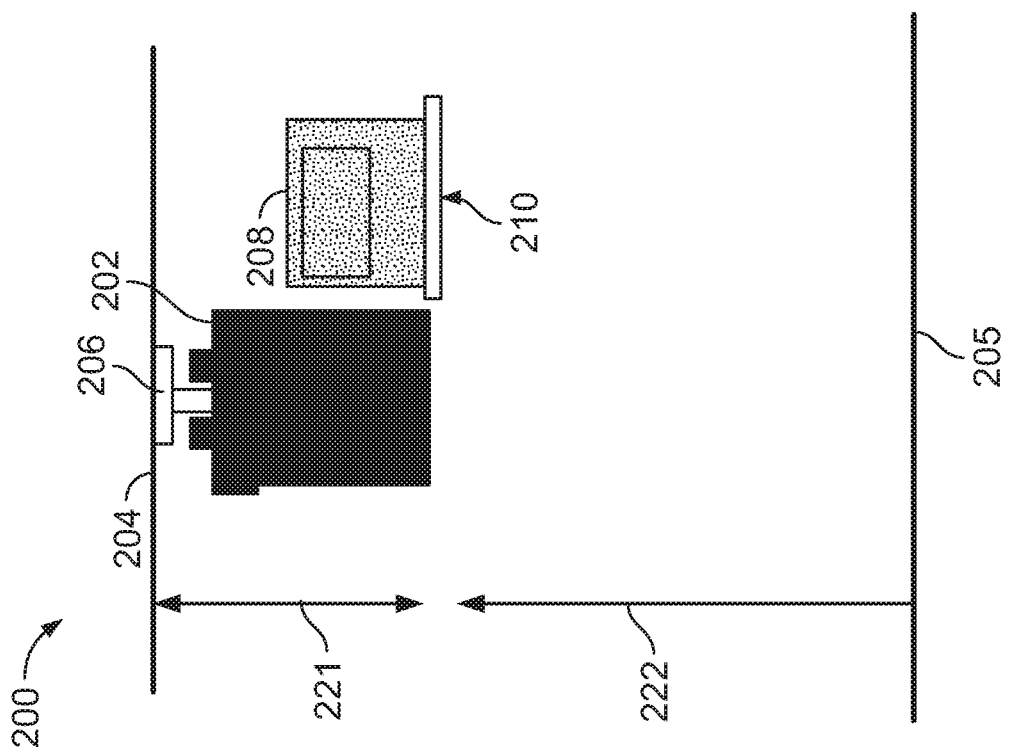

FIGS. 2a-2b depict an Automated Material Handling System (AMHS) 200, which may be employed in the IC chip manufacturing environment 101 of FIG. 1. In the illustrated embodiment, the AMHS 200 includes a suspended track 206, and an overhead hoist transport vehicle 202 configured to travel on the track 206. The overhead hoist transport vehicle 202 is configured to pick/place a FOUP 208 from/to a movable shelf 210. For example, the overhead hoist transport vehicle 202 may extend a distance 221 of about 0.9 m below a ceiling 204, and the movable shelf 210 may be disposed a distance 222 of about 2.6 m above a floor 205. Accordingly, the ceiling 204 may be a distance 220 of about 3.5 m above the floor 205.

In the preferred embodiment, the movable shelf 210 is suspended above the floor 205 of the IC chip manufacturing facility. For example, the movable shelf 210 may be suspended from the structure of the track 206, from the ceiling 204, or from any other suitable structure. Because movable shelves like the shelf 210 may be suspended on either side or on both sides of the track 206, the shelf 210b provides offset Zero Footprint Storage (ZFS) for the FOUP 208, thereby providing more efficient use of space in the IC chip manufacturing environment.

As described above, the overhead hoist transport vehicle 202 is configured to pick/place the FOUP 208 from/to the movable shelf 210. To that end, the overhead hoist transport vehicle 202 moves along the suspended track 206 to a position at the side of the shelf 210. As shown in FIG. 2a, the shelf 210 disposed beside the track 206 may be at substantially the same height as the overhead hoist transport vehicle 202. Next, the shelf 210 moves laterally to a position substantially directly underneath the overhead hoist within the overhead hoist transport vehicle 202, as indicated by directional arrows 209. (see FIG. 2b). The overhead hoist transport vehicle 202 includes a hoist gripper (see, e.g., the hoist gripper 426 of FIG. 5) configured to pick/place the FOUP 208 directly from/to the shelf 210. Once the FOUP 208 is held by the hoist gripper, the overhead hoist transport vehicle 202 may move it to a workstation or processing machine on the IC chip manufacturing floor.

FIGS. 3a-3b depict an Automated Material Handling System (AMHS) 300, which may be employed in the IC chip manufacturing environment 101 of FIG. 1. Like the AMHS 200 (see FIGS. 2a-2b), the AMHS 300 includes a suspended track 306, and an overhead hoist transport vehicle 302 configured to travel on the track 306. However, whereas the overhead hoist transport vehicle 202 included in the AMHS 200 picks/places the FOUP 208 from/to the movable shelf 210 disposed in a single row of shelves, the overhead hoist transport vehicle 302 is configured to pick/place FOUPs 308 from/to selected movable shelves 310-311 disposed in respective rows of shelves. For example, the overhead hoist transport vehicle 302 may extend a distance 321 of about 0.9 m below a ceiling 304, the shelf 310 may be disposed at substantially the same height as the overhead hoist transport vehicle 302, and the shelf 311 may be disposed a distance 323 of about 0.4 m below the shelf 310b and a distance 322 of about 2.6 m above a floor 305. Accordingly, the ceiling 304 may be a distance 320 of about 3.9 m above the floor 305.

Because the movable shelves 310-311 may be suspended from the structure of the track 306, from the ceiling 304, or from any other suitable structure, the shelves 310-311 provide multiple rows or levels of offset Zero Footprint Storage (ZFS) for the FOUPs 308. Further, each row of shelves is substantially directly above or below an adjacent row of shelves, thereby forming at least one shelf array including multiple rows and multiple columns of shelves. It is noted that the top row of shelves in the shelf array (including the shelf 310) may be at substantially the same height as the overhead hoist transport vehicle 302.

In the illustrated embodiment, the overhead hoist transport vehicle 302 is configured to pick/place the FOUPs 308 from/to the movable shelves 310-311. To pick the FOUP 308 from the shelf 310, the overhead hoist transport vehicle 302 moves along the suspended track 306 to a position at the side of the shelf 310. Next, the shelf 310 moves laterally to a position directly underneath the overhead hoist within the overhead hoist transport vehicle 302, as indicated by directional arrows 309 (see FIG. 3b). Like the overhead hoist transport vehicle 202, the overhead hoist transport vehicle 302 includes a hoist gripper (see, e.g., the hoist gripper 426 of FIG. 5) configured to pick/place the FOUP 308 directly from/to the shelf 310. Once the FOUP 308 is picked from the shelf 310 and held by the hoist gripper, the overhead hoist transport vehicle 302 may move it to a workstation or processing machine on the IC chip manufacturing floor.

To pick the FOUP 308 from the shelf 311 in the same column as the shelf 310 but in the row below the shelf 310, the overhead hoist transport vehicle 302 positions itself at the side of the shelf 310. Next, the shelf 311 moves laterally to a position substantially directly underneath the overhead hoist within the overhead hoist transport vehicle 302, as indicated by the directional arrows 309. The overhead hoist is then lowered in a conventional manner toward the shelf 311 to pick the FOUP 308 from the shelf 311 using the hoist gripper. Next, the overhead hoist is raised so that the FOUP 308 is held by the hoist gripper within the overhead hoist transport vehicle 302, which may then move it to a workstation or processing machine on the IC chip manufacturing floor. Finally, the shelf 311 moves back to its original position in the shelf array.

It should be understood that the overhead hoist included in the overhead hoist transport vehicle 302 may access WIP parts stored on selected movable shelves (e.g., the shelves 310-311) disposed in the same column of shelves from the same position on the suspended track 306. In this way, the overhead hoist transport vehicle 302 may access one or more levels of WIP storage from a single track position.

Figure 4B:
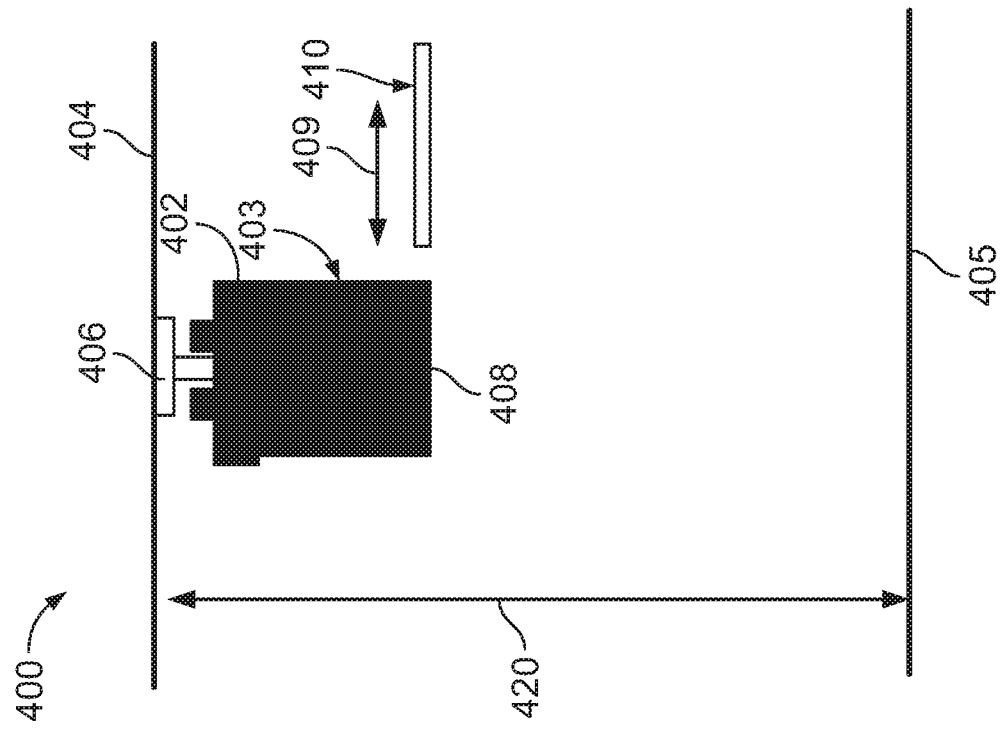
FIGS. 4a-4b are block diagrams of a second embodiment of offset zero footprint storage employed in the automated material handling system of FIG. 1, in which the offset zero footprint storage comprises a single row of fixed shelves and an overhead hoist mechanism mounted on a translating stage.
Figure 4A:
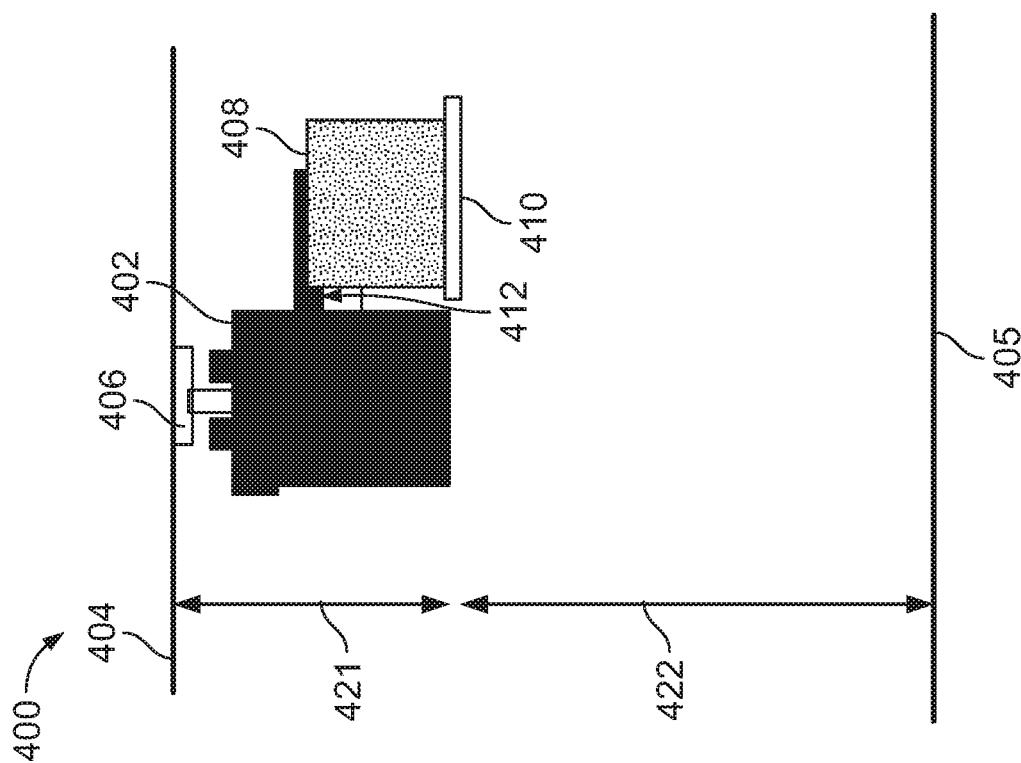

FIGS. 4a-4b depict an Automated Material Handling System (AMHS) 400, which may be employed in the IC chip manufacturing environment 101 of FIG. 1. In the illustrated embodiment, the AMHS 400 includes a suspended track 406, and an overhead hoist transport vehicle 402 configured to travel on the track 406. The overhead hoist transport vehicle 402 is configured to pick/place a FOUP 408 from/to a passive or fixed shelf 410. For example, the overhead hoist transport vehicle 402 may extend a distance 421 of about 0.9 m below a ceiling 404, and the fixed shelf 410a may be disposed a distance 422 of about 2.6 m above a floor 405. It is noted that the shelf 410 may be at substantially the same height above the floor as the overhead hoist transport vehicle 402. Accordingly, the ceiling 404 may be a distance 420 of about 3.5 m above the floor 405.

It should be understood that a plurality of fixed shelves like the shelf 410 may be disposed in a single row or in multiple rows beside and substantially parallel to the track 406. Moreover, one or more rows of fixed shelves may be located on either side or on both sides of the track 406. Because multiple rows of fixed shelves may be suspended beside the track 406 from the track structure, from the ceiling 404, or from any other suitable structure, the fixed shelves provide multiple levels of offset Zero Footprint Storage (ZFS) for the FOUP 408.

Figure 14A:
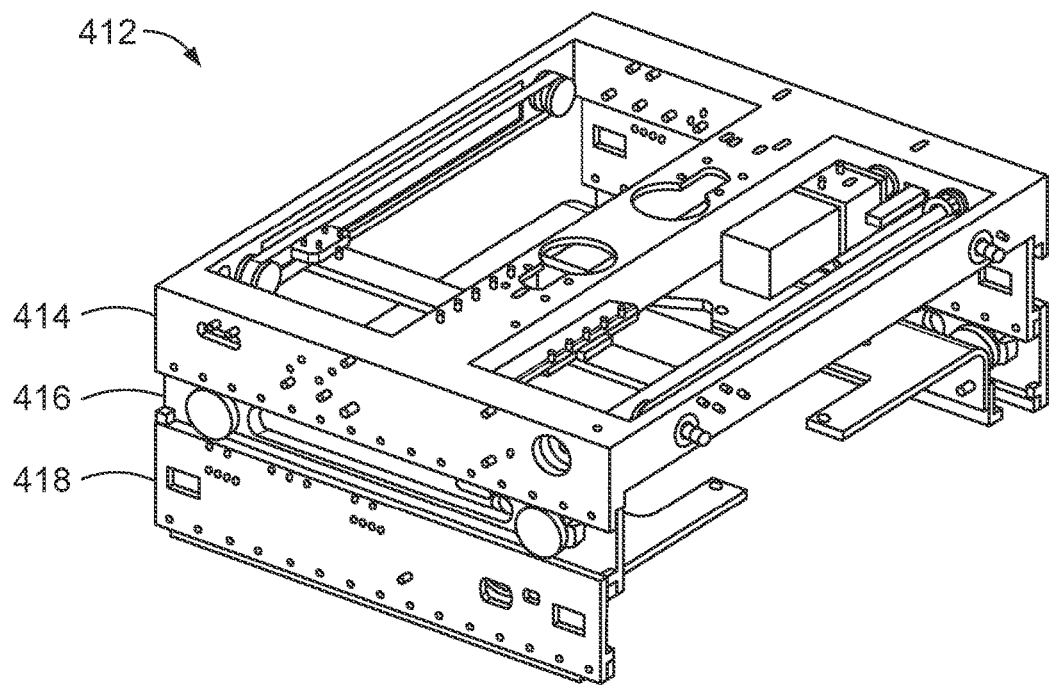
FIGS. 14a-14b are perspective views of the translating stage of FIGS. 4a-4b.
Figure 14B:
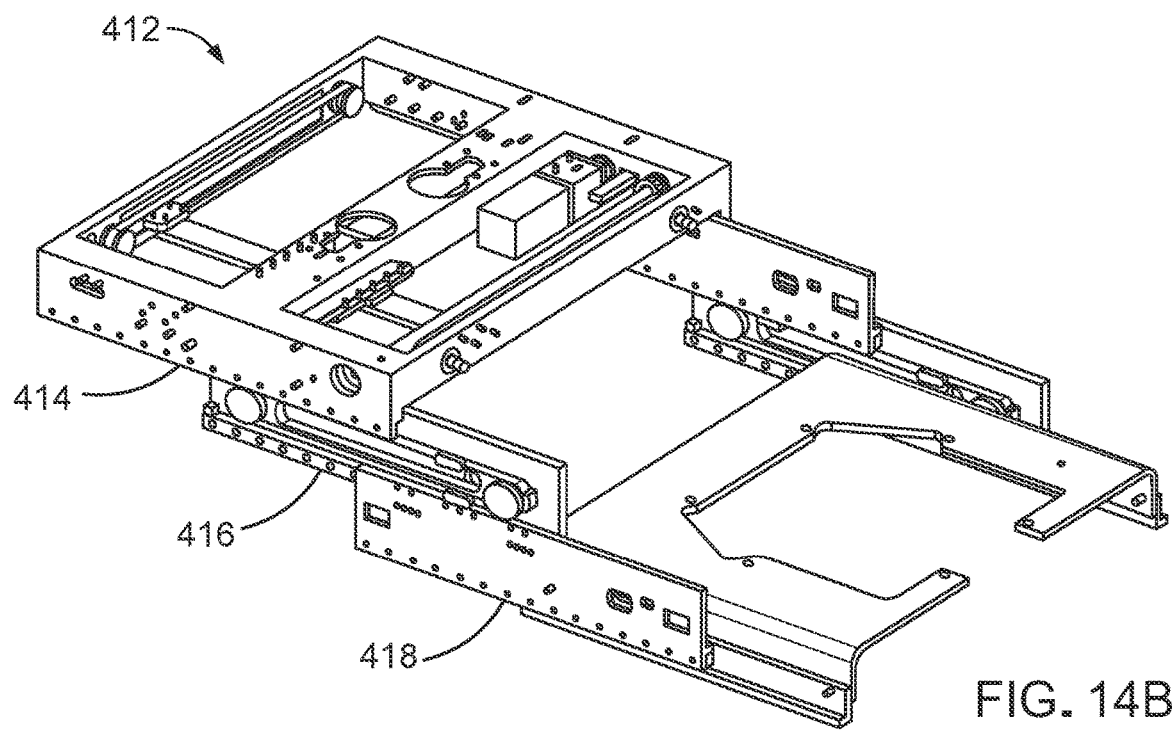

In the illustrated embodiment, the overhead hoist included in the overhead hoist transport vehicle 402 is mounted on a translating stage 412 configured to move the hoist to a position beside the transport vehicle 402 and substantially directly above a selected fixed shelf. FIG. 14a depicts the translating stage 412 in a retracted configuration, and FIG. 14b depicts the translating stage 412 in a laterally extended configuration. As shown in FIG. 14a and FIG. 14b, the translating stage 412 includes a first part 414, a second part 416 configured to extend laterally from the first part 414, and a third part 418 configured to extend laterally from the second part 416. When the translating stage 412 is in a retracted configuration (e.g., as depicted in FIG. 14a), the second part 416 is unextended relative to the first part 414 and the third part 418 is unextended relative to the second part 416 such that the first part 414, the second part 416, and the third part 418 are positioned vertically on top of each other and the third part 418 is positioned within the overhead hoist transport vehicle e.g., the overhead hoist transport vehicle 402). When the translating stage 412 is in an extended configuration (e.g., as depicted in FIG. 14b), the second part 416 is extended relative to the first part 414 and the third part 418 is extended relative to the second part 416 such that the third part 418 is in a position exterior to the overhead hoist transport vehicle (e.g., the overhead hoist transport vehicle 402).

To pick the FOUP 408 from the shelf 410 (see FIGS. 4a-4b), the overhead hoist transport vehicle 402 moves along the suspended track 406 to a position at the side of the shelf 410. Next, the translating stage 412 moves laterally to the position above the shelf 410, as indicated by directional arrows 409 (see FIG. 4a). A hoist gripper 426 (see FIG. 5) is then operated to pick/place the FOUP 408 directly from/to the shelf 410. In an embodiment, the hoist gripper 426 is mounted on an underside of the third part 418 of the translating stage 412. Once the FOUP 408 is picked from the shelf 410 and held by the hoist gripper 426, the translating stage 412 moves back to its original position within the overhead hoist transport vehicle 402. It is noted that as the translating stage 412 returns to its original position within the transport vehicle 402, the FOUP 408 moves into the transport vehicle 402 through a cowl opening 403 (see FIG. 4b). The overhead hoist transport vehicle 402 may then move the FOUP 408 to a workstation or processing machine on the IC chip manufacturing floor.

It is understood that the overhead hoist included in the overhead hoist transport vehicle 402 may access WIP parts disposed on selected fixed shelves (e.g., the shelf 410a) disposed in the same column of shelves from the same position on the suspended track 406. For example, to access a FOUP disposed on a fixed shelf in the same column as the shelf 410 but in a row below the shelf 410, the overhead hoist may be lowered in the conventional manner to a suitable level at the side of the lower shelf, and the translating stage 412 may be moved laterally to allow the hoist gripper 426 to pick/place the FOUP from/to the shelf. In this way, the overhead hoist transport vehicle 402 may access one or more levels of WIP storage from a single track position.

FIG. 5 depicts an illustrative application of the AMHS 400 (see also FIGS. 4a-4b), in which the AMHS 400 is employed in conjunction with a WIP storage unit 500 (a "stocker"). In the illustrated embodiment, the stocker 500 includes a plurality of storage bins such as a shelf 510 disposed within the stocker housing. The storage bins within the stocker 500 are rotated around a central axis and positioned to a storage unit location that allows extraction by the overhead hoist transport vehicle 402. To pick a FOUP 508 from the shelf 510, the overhead hoist transport vehicle 402 moves along the suspended track 406 to a position at the side of the shelf 510. Next, the translating stage 412 moves laterally to a position substantially directly above the shelf 510, as indicated by the directional arrows 409. The hoist gripper 426 is then operated to pick the FOUP 508 directly from the shelf 510 to extract the FOUP 508 from the stocker 500. It is understood that the hoist gripper 426 may alternatively be employed to place a FOUP to the shelf 510 within the stocker 500. Once the FOUP 508 is picked from the shelf 510 and held by the hoist gripper 426, the translating stage 412 moves back to its original position within the overhead hoist transport vehicle 402, which subsequently moves the FOUP 408 to a workstation or processing machine on the IC chip manufacturing floor.

It is noted that the overhead hoist of FIG. 5 may alternatively pick/place a FOUP from/to a shelf external to the stocker 500. For example, the stocker 500 may include one or more movable shelves, in which each shelf is configured to move laterally from a first position inside the stocker 500 to a second position outside the stocker 500 to provide the overhead hoist access to the FOUP. Once the FOUP is picked from the shelf and held by the hoist gripper 426, the shelf moves back to its original position within the stocker 500. Using the overhead hoist of FIG. 5 to access FOUPs directly from the stocker 500 obviates the need for traditional I/O mechanisms such as the input/output ports 118-119 (see FIG. 1), thereby reducing system costs.

Figure 6:
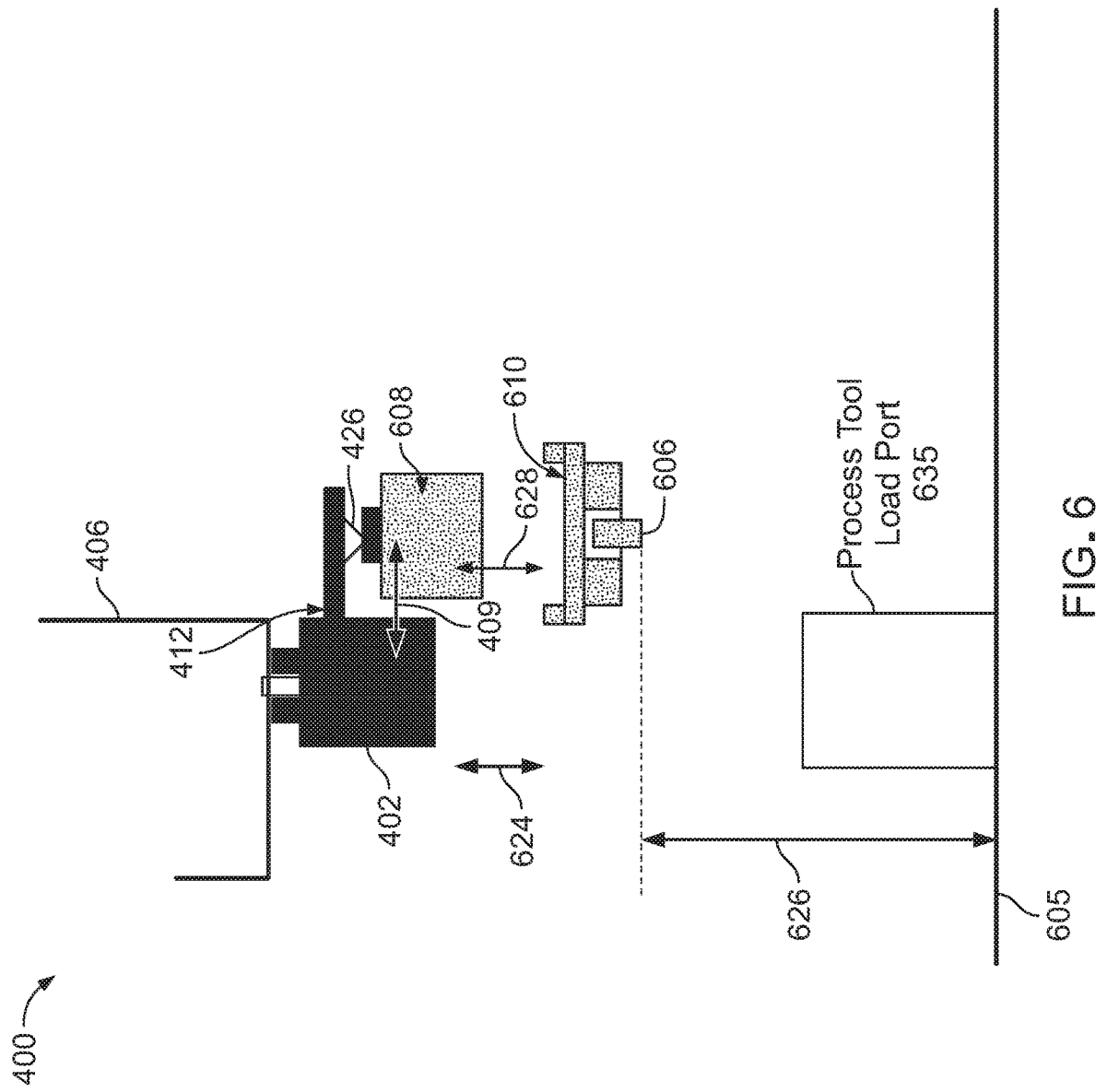
FIG. 6 is a block diagram of the overhead hoist mechanism of FIG. 4 employed in conjunction with a WIP part conveying system.

FIG. 6 depicts an illustrative application of the AMHS 400 (see also FIGS. 4a-4b), in which the AMHS 400 is employed in conjunction with an overhead WIP conveyor 610. In the illustrated embodiment, the overhead hoist mounted on the translating stage 412 is employed to pick/place a FOUP 608 directly from/to the WIP conveyor 610, which is configured to travel along a rail 606. It should be understood that the rail 606 extends in a direction perpendicular to the plane of the drawing of FIG. 6. The overhead hoist may also be employed to pick the FOUP 608 from the rail-based conveyor 610, and to place the FOUP 608 to, e.g., a process tool load port 635, and vice versa. For example, the overhead hoist transport vehicle 402 may be disposed a distance 624 of about 0.35 m above the rail-based conveyor 610. Further, the overhead rail 606 may be a distance 626 of about 2.6 m above a floor 605 of the IC manufacturing facility.

It is noted that overhead hoist transport vehicles traveling on suspended tracks, e.g., the track 406, are normally employed to provide "hop-to-hop" transport of FOUPs between adjacent workstations and processing machines. In contrast, the rail-based conveyor 610 may be employed to provide express transport of FOUPs between workstations and processing machines located a substantial distance apart on the IC chip manufacturing floor. By using the rail-based conveyor 610 to move FOUPs substantial distances across the IC chip manufacturing facility, transport system congestion can be significantly reduced.

As described above, the overhead hoist mounted on the translating stage 412 may be employed to pick/place the FOUP 608 from/to the rail-based conveyor 610. To that end, the overhead hoist transport vehicle 402 and the rail-based conveyor 610 move so that the transport vehicle 402 with the FOUP 608 disposed therein is positioned at the side of the conveyor 610. Next, the translating stage 412 moves laterally to position the FOUP 608 substantially directly above the surface of the conveyor 610, as indicated by the directional arrows 409. The overhead hoist is then lowered in a conventional manner toward the conveyor 610, as indicated by directional arrows 628. Next, the overhead hoist is operated to place the FOUP 608 to the conveyor 610, which subsequently transports the FOUP 608 across the IC chip manufacturing floor.

Figure 7:
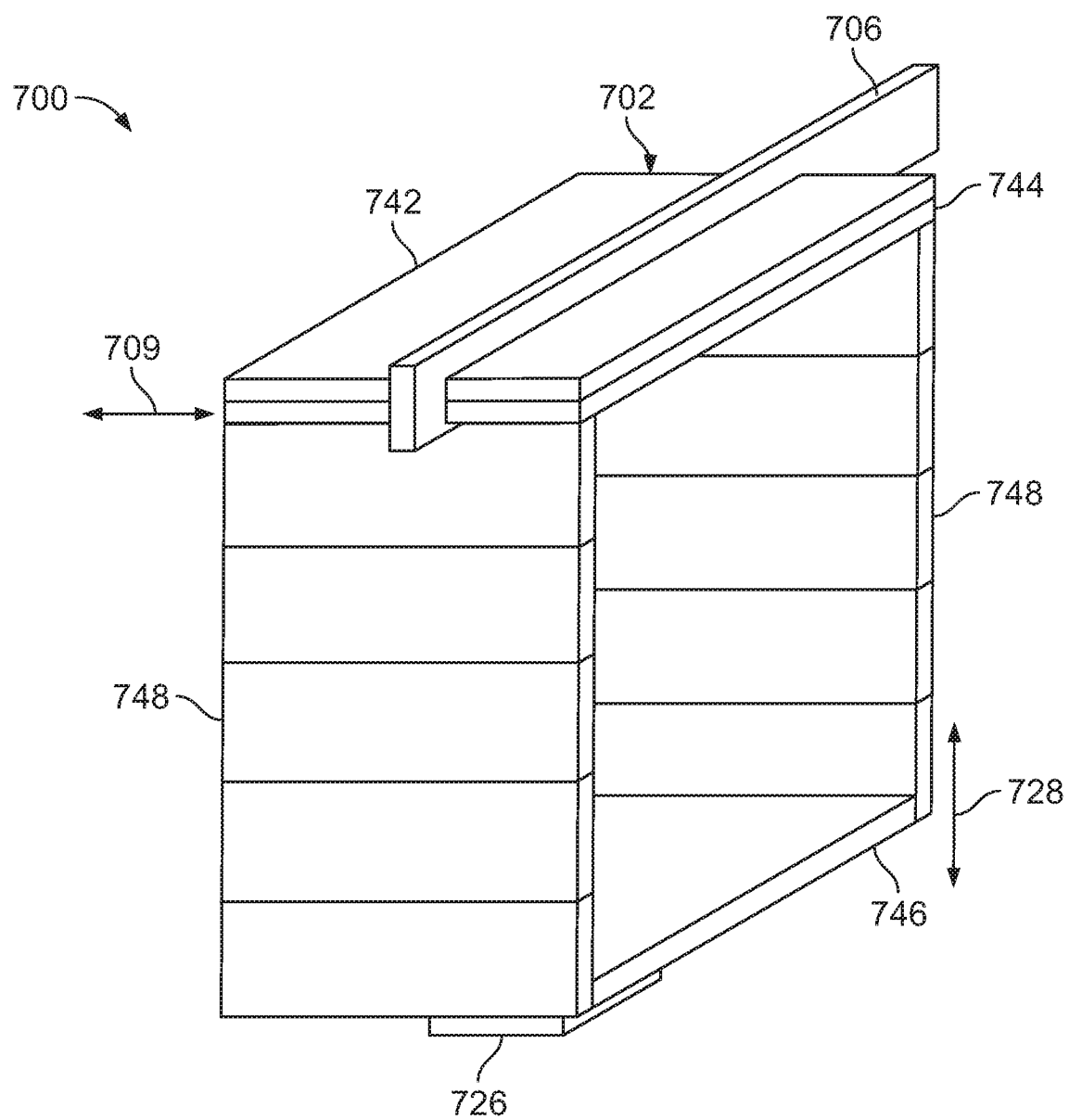
FIG. 7 is a perspective view of an alternative embodiment of the overhead hoist mechanism of FIG. 4.

FIG. 7 depicts an alternative embodiment 700 of the AMHS 400 of FIGS. 4a-4b. Like the AMHS 400, the AMHS 700 is configured to pick/place a FOUP from/to a passive or fixed shelf. In the illustrated embodiment, the AMHS 700 includes a suspended track 706 and an overhead hoist transport vehicle 702 supported by the track 706. As shown in FIG. 7, the overhead hoist transport vehicle 702 includes a proximal end portion 744, a distal end portion 746, and suspension elements 748 coupled between the proximal and distal ends 744 and 746. The overhead hoist transport vehicle 702 further includes an overhead hoist 725 having a hoist gripper 726 mounted at the distal end 746, and a transport member 742 movably coupled to the proximal end 744 and configured to allow the transport vehicle 702 to travel on the track 706.

Specifically, the proximal end 744 is configured to move laterally relative to the transport member 742 in a direction substantially perpendicular to the track 706, as indicated by directional arrows 709. For example, the proximal end 744 may operate as a Y-table, a pneumatic mechanism, a stepper servo mechanism, or any other suitable mechanism providing a relatively long lateral excursion. Further, the distal end 746 is configured to move in a vertical direction, as indicated by directional arrows 728. For example, the distal end 746 may be coupled at the ends of the suspension elements 748, which may be configured to telescope to allow the distal end 746 to move in the desired vertical direction. Accordingly, the combination of the proximal end 744 and the suspension elements 748 allows the distal end 746 carrying the hoist gripper 726 to move with 2-degrees-of-freedom, as specified by the directional arrows 709 and 728.

Figure 8:
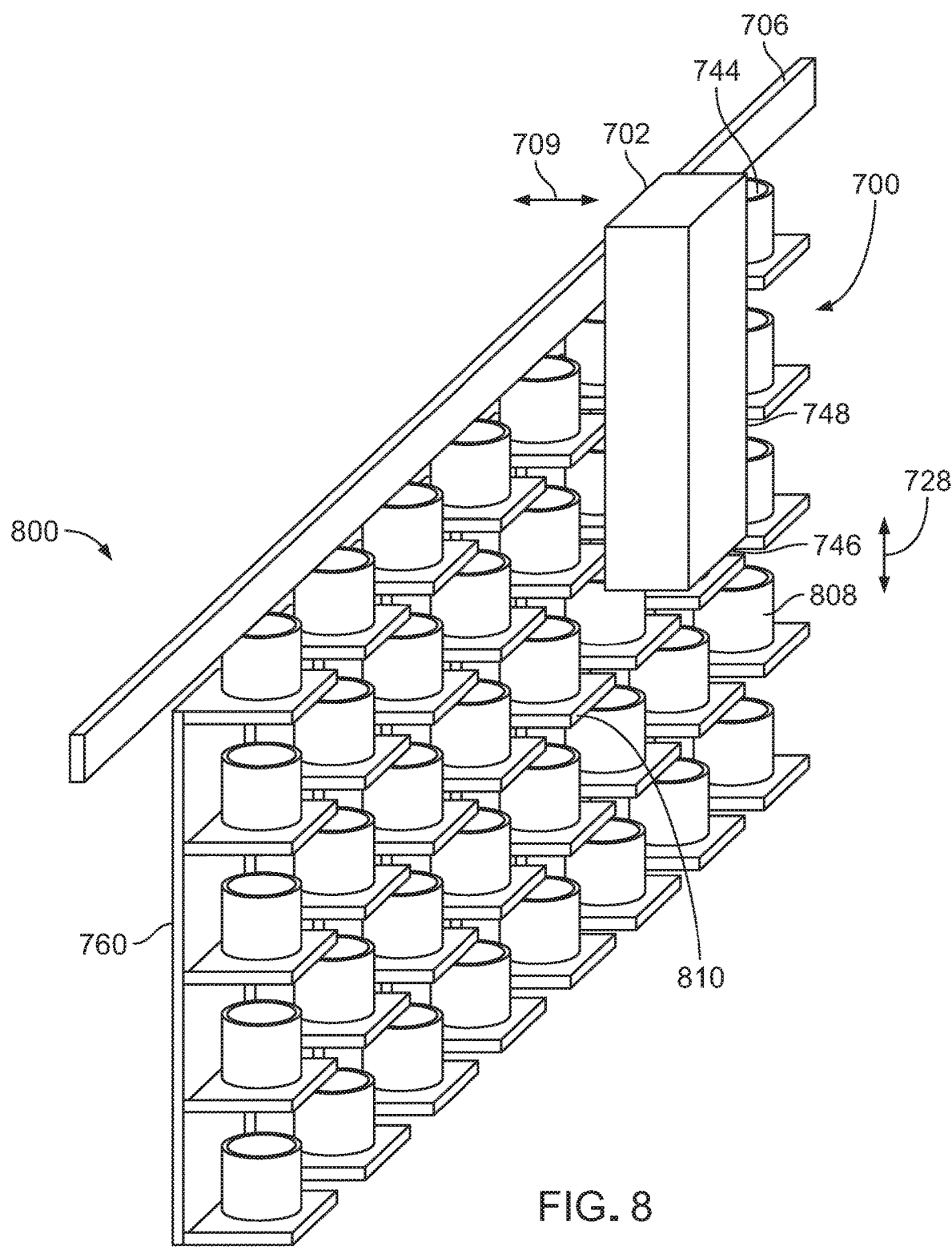
FIG. 8 is a perspective view of the overhead hoist mechanism of FIG. 7 employed in conjunction with an array of fixed shelves.

FIG. 8 depicts the AMHS 700 of FIG. 7 employed in conjunction with an array 800 of passive or fixed shelves. In the illustrated embodiment, the overhead hoist transport vehicle 702 is configured to pick/place FOUPs, e.g., a FOUP 808, from/to selected shelves within the array 800, which includes multiple rows and multiple columns of fixed shelves such as a shelf 810. As shown in FIG. 8, the shelf array 800 is disposed beside and substantially parallel to the suspended track 706. Further, each shelf is attached along a single edge to a vertical support member 760 that may be anchored to the floor, and adjacent columns of shelves are spaced to allow the respective suspension elements 748 to fit in the spaces between the adjacent columns. It is noted that in this configuration, the FOUPs 808 are exposed for manual access, if desired.

For example, to pick the FOUP 808 from the shelf 810, the overhead hoist transport vehicle 702 moves along the suspended track 706 to a position at the side of the column including the shelf 810. Next, the distal end 746 including the hoist gripper 726 moves down, as indicated by the directional arrows 728, to a position at the side of the shelf 810 holding the FOUP 808. The proximal end 742 then moves laterally, as indicated by the directional arrows 709, to position the hoist gripper 726 substantially directly above the shelf 810 beside the track 706. It is noted that as the proximal end 742 performs its lateral movement, the respective suspension elements 748 are accommodated in the spaces on each side of the column of shelves.

Once the FOUP 808 is picked from the shelf 810 by the hoist gripper 726, the proximal end 742 moves back to its original position underneath the track 706, thereby allowing the distal end 746 with the hoist gripper 726 holding the FOUP 808 to move back up toward the track 706. The transport member 702 may then move the FOUP 808 to a workstation or processing machine on the IC chip manufacturing floor. It should be understood that the overhead hoist transport vehicle 702 may access WIP parts stored on selected shelves disposed in the same column of shelves from the same position on the suspended track 706. In this way, the overhead hoist transport vehicle 702 may access one or more levels of WIP storage from a single track position.

Figure 9:
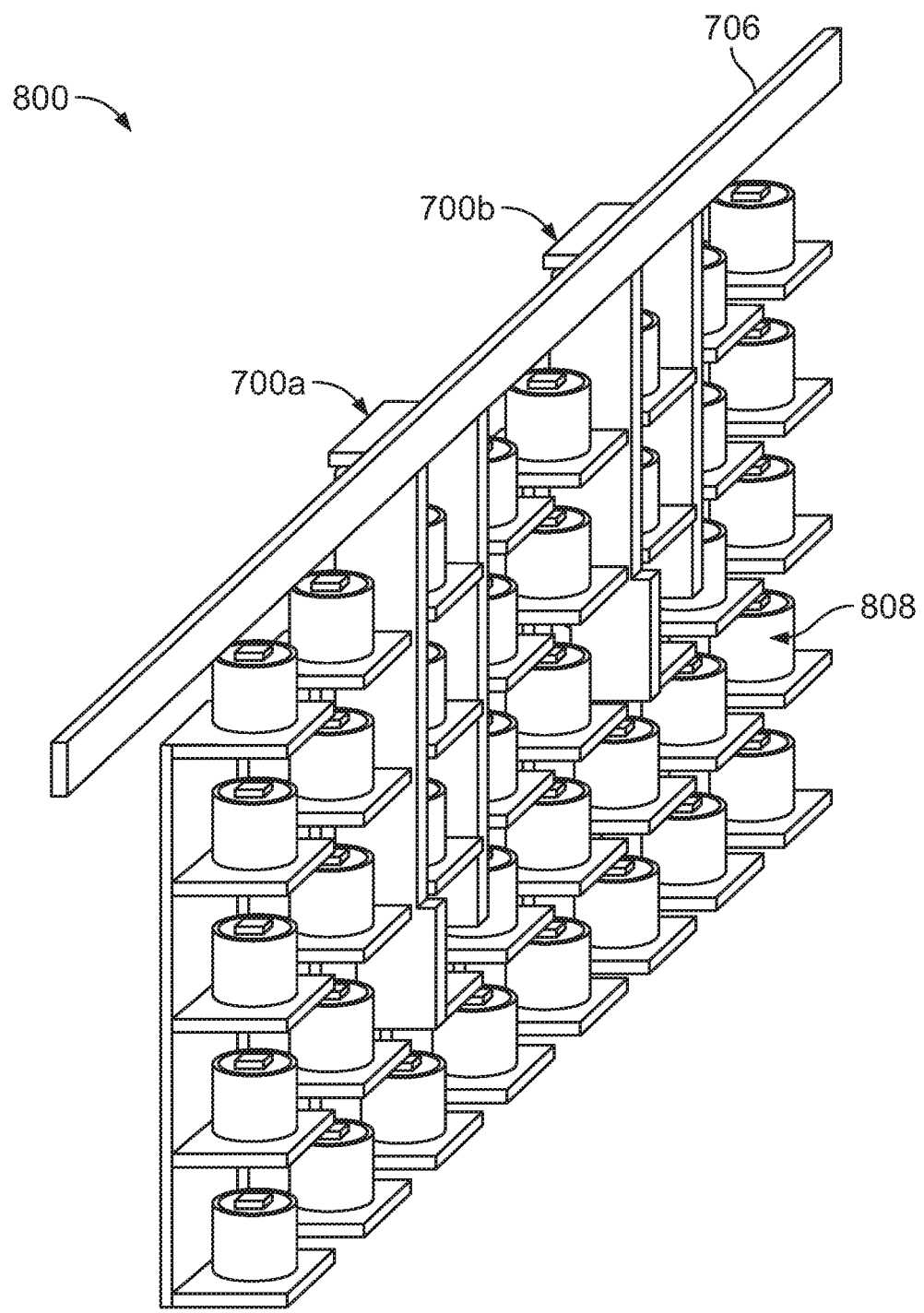
FIG. 9 is a perspective view of multiple overhead hoist mechanisms like the overhead hoist mechanism of FIG. 7, in which the overhead hoist mechanisms travel on the same track and are employed in conjunction with an array of fixed shelves.

FIG. 9 depicts a plurality of Automated Material Handling Systems (AMHS) 700a-700b employed in conjunction with the array of shelves 800. It should be understood that each of the AMHSs 700a-700b is like the AMHS 700 of FIG. 7. In the illustrated embodiment, the AMHSs 700a-700b are configured to travel on the single suspended track 706 to allow simultaneous accesses of the FOUPs 808 stored in the shelf array 800, thereby assuring high system throughput.

Figure 10:
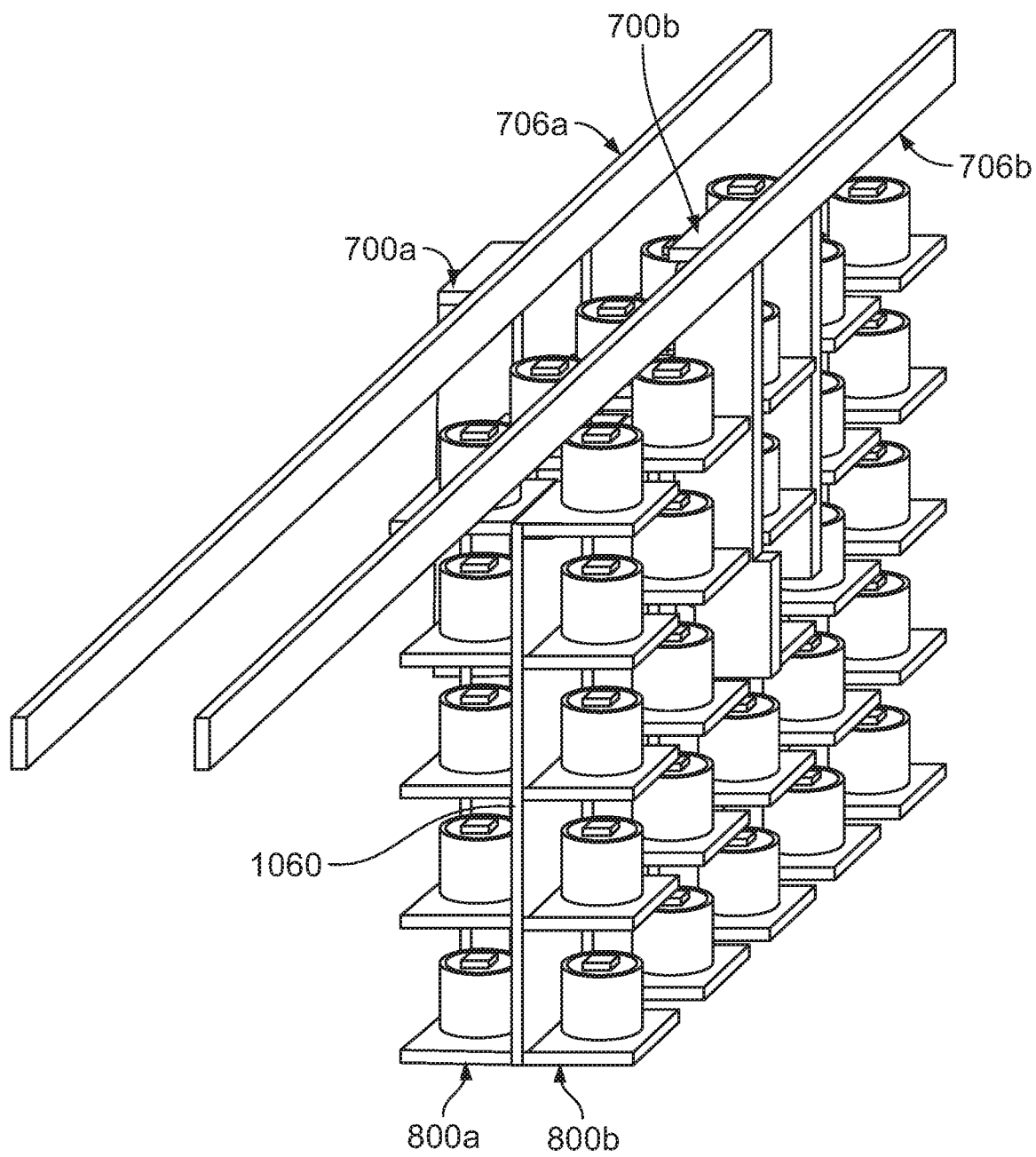
FIG. 10 is a perspective view of multiple overhead hoist mechanisms like the overhead hoist mechanism of FIG. 7, in which the overhead hoist mechanisms travel on respective tracks and are employed in conjunction with back-to-back arrays of fixed shelves.

FIG. 10 depicts the AMHSs 700a-700b employed in conjunction with two arrays 800a-800b of shelves in a back-to-back configuration for increased storage density. As shown in FIG. 10, each shelf in the shelf arrays 800a-800b is attached along a single edge to a vertical support member 1060, which may be anchored to the floor. It should be understood that each of the shelf arrays 800a-800b is like the shelf array 800 (see FIG. 8) in that adjacent columns of shelves are spaced to allow the respective suspension elements 748 to fit in the spaces between the adjacent columns. In the illustrated embodiment, the AMHSs 700a-700b are configured to travel on suspended tracks 706a-706b, respectively, to allow simultaneous accesses of the FOUPs stored in the shelf arrays 800a-800b, thereby assuring high system throughput. Because the system configurations of FIGS. 8-10 do not require robots for accessing the FOUPs (as in conventional material handling systems), floor space requirements and system costs are reduced, while system reliability is enhanced.

Figure 11:
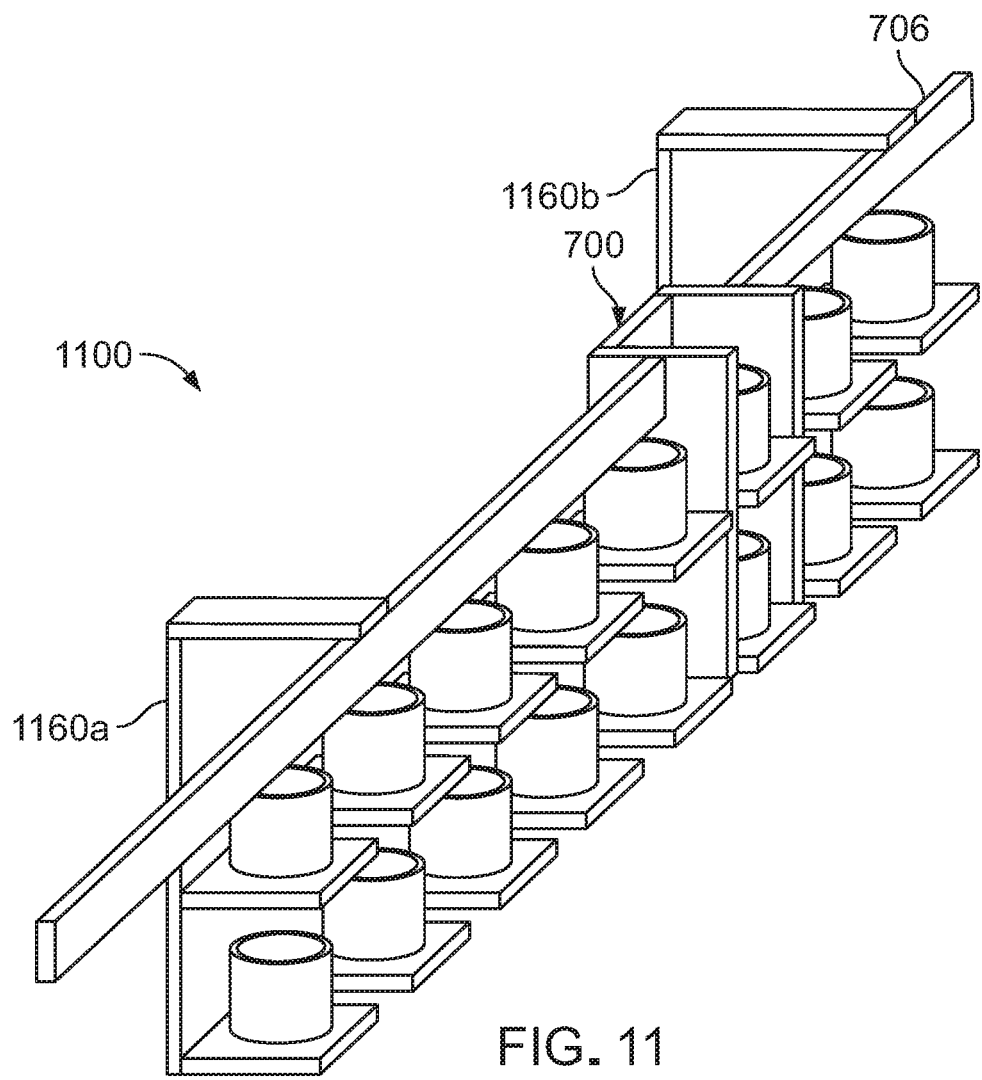
FIG. 11 is a perspective view of a third embodiment of offset zero footprint storage, in which the overhead hoist mechanism of FIG. 7 is employed in conjunction with multiple rows of fixed shelves.

FIG. 11 depicts the AMHS 700 of FIG. 7 employed in conjunction with an array 1100 of fixed shelves. Like the shelf array 800 (see FIG. 8), the shelf array 1100 is disposed beside and substantially parallel to the suspended track 706. Further, each shelf is attached along a single edge to one or more vertical support members 1160a-1160b, and adjacent columns of shelves are spaced to allow the respective suspension elements 748 to fit in the spaces between the adjacent columns. However, whereas the shelf array 800 is anchored to the floor, the shelf array 1100 is suspended from the structure of the track 706 by the support members 1160a-1160b. It is understood that the shelf array 1100 may alternatively be suspended from the ceiling or any other suitable structure. As a result, the shelf array 1100 provides multiple rows or levels of offset Zero Footprint Storage (ZFS) for the FOUPs stored therein.

Figure 12A:
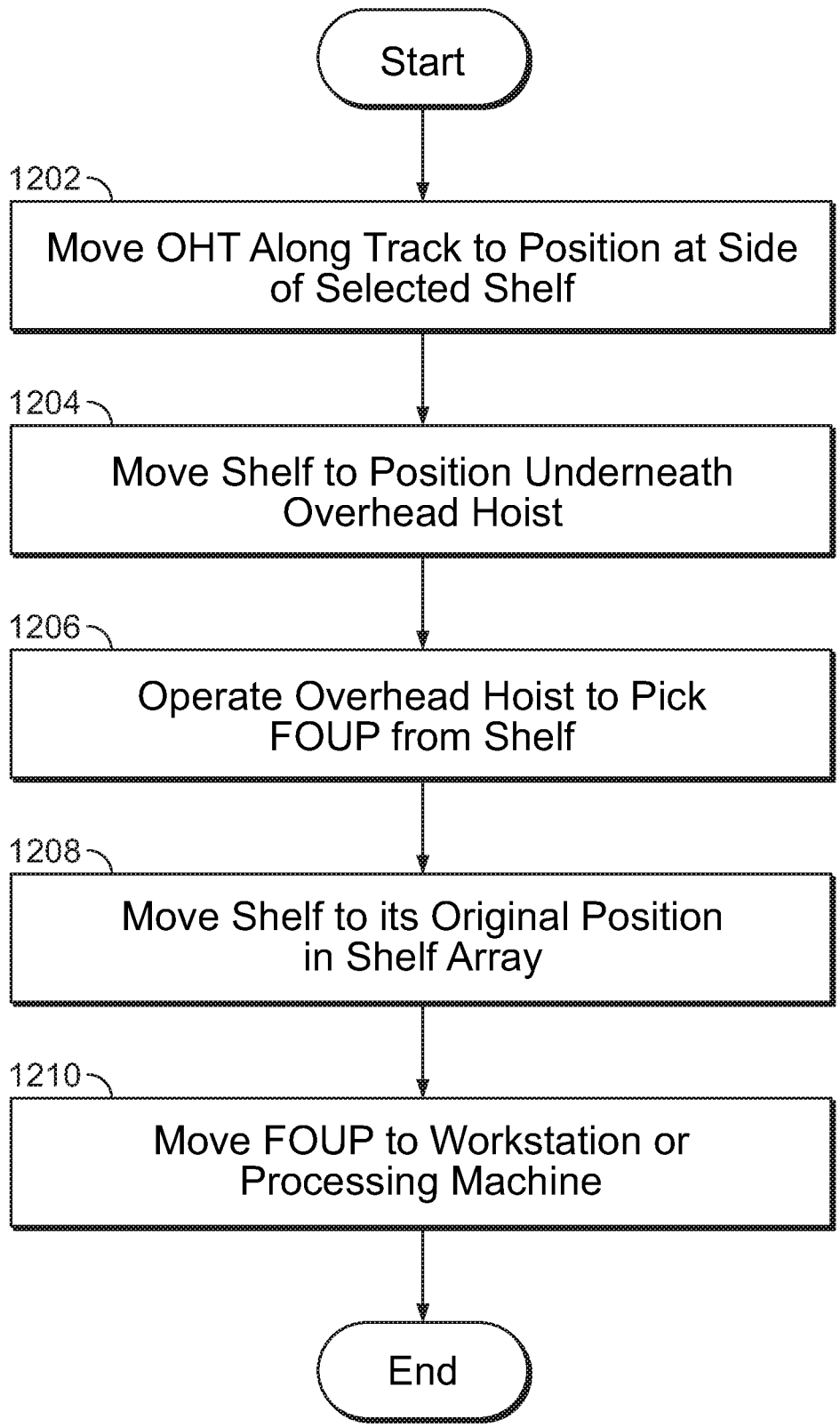
FIGS. 12a-12b are flow diagrams of illustrative methods of operating the automated material handling system of FIG. 1.

A first method of operating the presently disclosed automated material handling system is illustrated by reference to FIG. 12a. As depicted in step 1202, an Overhead Hoist Transport (OHT) vehicle moves along a suspended track to a position at the side of a selected movable shelf in a shelf array. The shelf has at least one FOUP disposed thereon. Next, the shelf moves, as depicted in step 1204, to a position underneath an overhead hoist included in the OHT vehicle. The overhead hoist is then operated, as depicted in step 1206, to pick the FOUP from the shelf. Next, the shelf moves, as depicted in step 1208, back to its original position in the shelf array. Finally, the OHT vehicle moves, as depicted in step 1210, the FOUP to a workstation or processing machine on the product manufacturing floor.

Figure 12B:
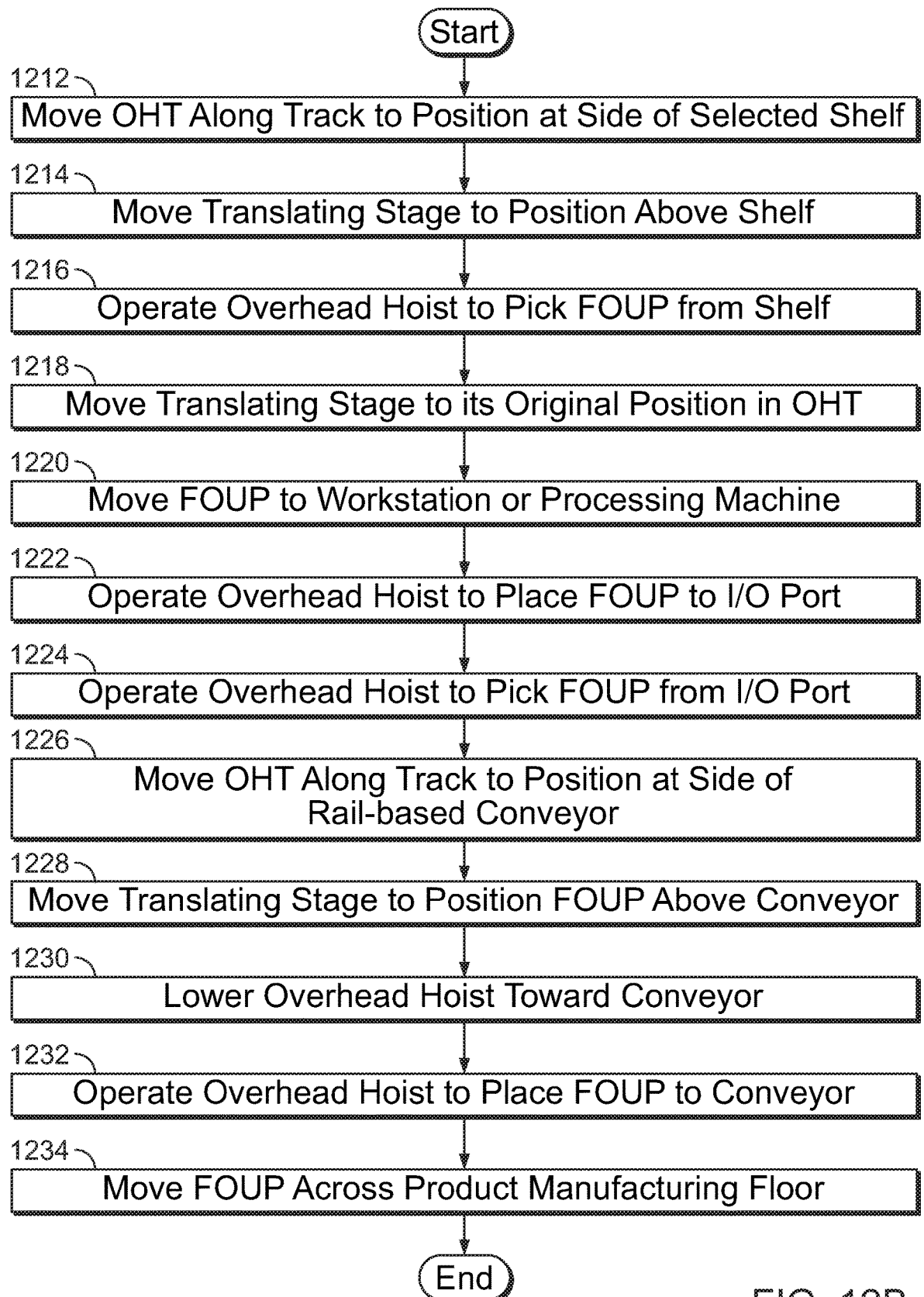

A second method of operating the presently disclosed automated material handling system is illustrated by reference to FIG. 12b. As depicted in step 1212, an OHT vehicle moves along a suspended track to a position at the side of a selected fixed shelf in a shelf array. The shelf has at least one FOUP disposed thereon. Next, a translating stage having an overhead hoist mounted thereon moves, as depicted in step 1214, to a position above the shelf. The overhead hoist is then operated, as depicted in step 1216, to pick the FOUP from the shelf. Next, the translating stage moves, as depicted in step 1218, back to its original position in the OHT vehicle. The OHT vehicle then moves, as depicted in step 1220, the FOUP to a workstation or processing machine on the product manufacturing floor. Next, the overhead hoist is operated, as depicted in step 1222, to place the FOUP to an I/O port of the processing machine, including moving the translating stage to a position above the I/O port, placing the FOUP to the I/O port, and moving the translating stage back to its original position within the OHT vehicle. The overhead hoist is then operated, as depicted in step 1224, to pick the FOUP from the I/O port of the processing machine. Next, the OHT vehicle moves, as depicted in step 1226, to a position at the side of a rail-based conveyor. The translating stage then moves, as depicted in step 1228, to position the FOUP above the rail-based conveyor. Next, the overhead hoist holding the FOUP is lowered, as depicted in step 1230, toward the conveyor, and the overhead hoist is operated, as depicted in step 1232, to place the FOUP to the conveyor. After the translating stage returns to its original position within the OHT vehicle, the rail-based conveyor moves, as depicted in step 1234, to transport the FOUP an extended distance across the product manufacturing floor.

Figure 13:
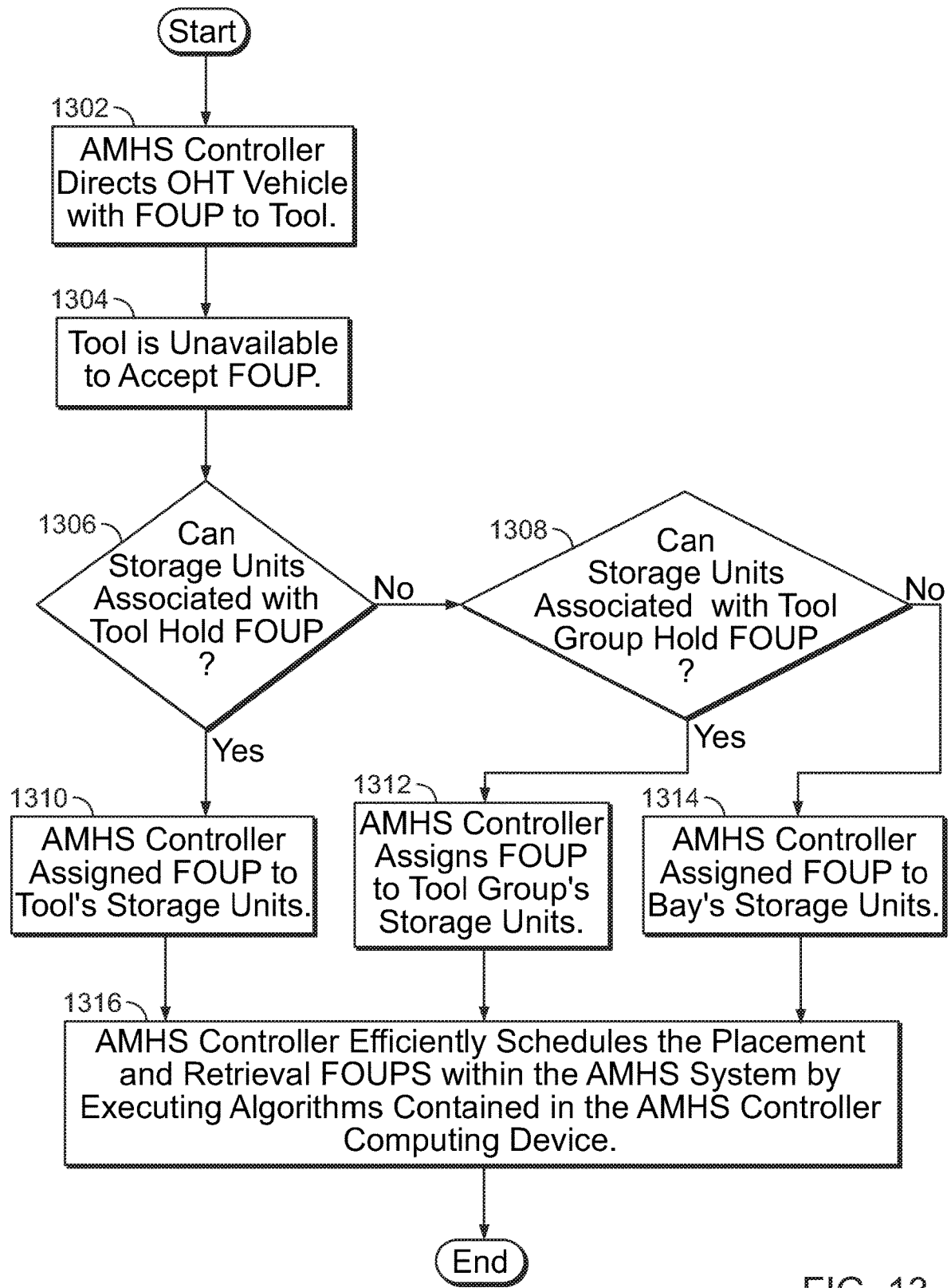
FIG. 13 is a flow diagram of an illustrative method of controlling the automated material handling system of FIG. 1.

A method of controlling the presently disclosed automated material handling system is illustrated by reference to FIG. 13. It is noted that storage locations may be configured to handle overflow FOUPs from a particular process tool, from a group of process tools, or from a semiconductor bay. A storage unit is one or more storage locations. An AMHS controller will attempt to store the FOUP near the destination tool and handle the storage within the storage location unit to optimize quick retrieval and deposit of other FOUPs within the unit. As depicted in step 1302, an AMHS controller directs an overhead hoist transport vehicle with a FOUP to a process tool. Next, the process tool is unavailable to accept the FOUP, as depicted in step 1304. A determination is then made, as depicted in step 1306, as to whether storage units associated with the process tool can hold the FOUP. If so, the AMHS controller assigns, as depicted in step 1310, the FOUP to the process tool's storage units. Otherwise, a determination is made, as depicted in step 1308, as to whether storage units associated with the process tool group can hold the FOUP. If so, the AMHS controller assigns, as depicted in step 1312, the FOUP to the process tool group's storage units. Otherwise, the AMHS controller assigns, as depicted in step 1314, the FOUP to a semiconductor bay's storage units. Following each of the steps 1310, 1312, and 1314, the AMHS controller efficiently schedules, as depicted in step 1316, the placement and retrieval of FOUPs within the AMHS system by executing algorithms included in the AMHS controller computing device.

Having described the above illustrative embodiments, other alternative embodiments or variations may be made. For example, it was described that the automated material handling system includes overhead hoist transport vehicles configured to move overhead hoists for accessing carriers such as Front Opening Unified Pods (FOUPs) in an IC chip manufacturing environment. However, it should be appreciated that the above-described automated material handling system may be employed in any suitable environment in which articles are stored and moved from place to place. For example, the automated material handling system described herein may be employed in an automobile manufacturing facility, and the WIP parts stored and moved by the system may comprise automobile parts.

It will also be appreciated by those of ordinary skill in the art that further modifications to and variations of the above-described system and method of accessing one or more levels of shelves by an overhead hoist transport vehicle from a single track position may be made without departing from the inventive concepts disclosed herein. Accordingly, the invention should not be viewed as limited except as by the scope and spirit of the appended claims.

What is claimed is:

1. An automated material handling system, comprising:
   a substantially horizontal overhead track suspended from a ceiling;
   an overhead hoist transport (OHT) vehicle configured to be suspended from, and moveably coupled to, the substantially horizontal overhead track;
   wherein the OHT vehicle comprises:
   a translating member having multiple parts configured to form a retracted configuration having a first length and configured to form an extended configuration having a second length, the first length being shorter than the second length, the translating member configured to extend laterally, by the extended configuration, to a position (i) exterior to the OHT vehicle through an opening on either side of the OHT vehicle and (ii) above a material unit held in a material storage location adjacent to the OHT vehicle to engage the material unit;
   wherein the multiple parts include a first part, a second part configured to extend laterally from the first part, and a third part configured to extend laterally from the second part;
   wherein the translating member is in the retracted configuration when (i) the first part, the second part, and the third part are positioned vertically on top of each other, (ii) the second part is unextended relative to the first part, and (iii) the third part is unextended relative to the second part and is positioned within the OHT vehicle;
   wherein the translating member is in the extended configuration when (i) the second part is extended relative to the first part, and (ii) the third part is extended relative to the second part and is in the position exterior to the OHT vehicle; and a gripper mounted on an underside of the third part of the translating member and configured to engage the material unit from a position below the translating member and above the material unit at times when the translating member is in the extended configuration, wherein the OHT vehicle is further configured to (i) extend in a vertical direction from the substantially horizontal overhead track suspended from the ceiling, and (ii) move along the substantially horizontal overhead track suspended from the ceiling to a position adjacent to the material storage location.

2. The automated material handling system of claim 1, further comprising a plurality of levels of material storage locations.

3. The automated material handling system of claim 2, wherein:
the side of the substantially horizontal overhead track comprises a first side of the substantially horizontal overhead track;
the plurality of levels of material storage locations comprise (i) a first plurality of material storage locations arranged in respective pluralities of rows and columns at the first side of the substantially horizontal overhead track, and (ii) a second plurality of material storage locations arranged in respective pluralities of rows and columns at a second side of the substantially horizontal overhead track; and the second side of the substantially horizontal overhead track is opposite the first side of the substantially horizontal overhead track.

4. The automated material handling system of claim 3, wherein the first plurality of storage locations is configured to be suspended at the first side of the substantially horizontal overhead track, and the second plurality of storage locations is configured to be suspended at the second side of the substantially horizontal overhead track.

5. The automated material handling system of claim 4, wherein the first and second pluralities of storage locations are configured to be suspended from the ceiling.

6. The automated material handling system of claim 2, wherein the plurality of levels of material storage locations comprise a plurality of rows and a plurality of columns.

7. The automated material handling system of claim 1, wherein the material unit comprises a Front Opening Unified Pod (FOUP).

8. The automated material handling system of claim 1, wherein the material unit comprises at least one manufactured part.

9. The automated material handling system of claim 1, wherein:
the side of the substantially horizontal overhead track comprises a first side of the substantially horizontal overhead track;
the material storage location comprises at least one material storage location disposed on a second side of the substantially horizontal overhead track; and
the second side of the substantially horizontal overhead track being opposite the first side of the substantially horizontal overhead track.

10. The automated material handling system of claim 9, wherein the material unit comprises a first material unit, and wherein:
the track position comprises a first track position;

the OHT vehicle is further configured to move to a second track position along the substantially horizontal overhead track, with the second track position adjacent to the material storage location disposed at the second side of the track;
the translating member is further configured to extend laterally relative to the substantially horizontal overhead track toward the second side of the track to place the gripper at a position proximate to the material storage location disposed at the second side of the track; and
the gripper is further configured to:
pick a second material unit from the material storage location disposed at the second side of the track; and
place the second material unit into the material storage location disposed at the second side of the track.

11. The automated material handling system of claim 1, wherein the side of the substantially horizontal overhead track comprises a first side of the substantially horizontal overhead track and the track position comprises a first track position, and wherein the automated material handling system further comprises:
a conveyor subsystem configured to carry at least one material unit, the conveyor subsystem being disposed at the first side of the substantially horizontal overhead track;
wherein the OHT vehicle is further configured to move to a second track position along the substantially horizontal overhead track adjacent the conveyor subsystem;
wherein the translating member is further configured to extend laterally relative to the substantially horizontal overhead track to place the gripper at a position proximate to the conveyor subsystem; and
wherein the gripper is further configured to pick the material unit from the conveyor subsystem and to place the material unit into the conveyor subsystem.

12. The automated material handling system of claim 11, wherein the conveyor subsystem comprises at least one rail, and the conveyor subsystem is further configured to carry the material unit along the at least one rail.

13. The automated material handling system of claim 1, wherein:
the OHT vehicle is further configured, when the material storage location is disposed at a level that is lower than a level of the OHT vehicle, to lower the gripper to approximately the level of the material storage location.

14. A method of operating an automated material handling system, comprising:
moving an overhead hoist (i) in a vertical direction away from a track position on a substantially horizontal overhead track suspended from a ceiling, and (ii) in a horizontal direction along the substantially horizontal overhead track to a material storage location;
wherein the material storage location is suspended (i) on a side of the substantially horizontal overhead track, (ii) beneath the substantially horizontal overhead track;
wherein the material storage location comprises a fixed shelf for storing a material unit;
wherein the overhead hoist comprises:
a translating member having multiple parts configured to form a retracted configuration having a first length and configured to form an extended configuration having a second length, the first length being shorter than the second length, the translating member configured to extend laterally, by the extended configuration, to a position (i) exterior to the OHT vehicle through an opening on either side of the OHT vehicle and (ii) above a material unit held in a material storage location adjacent to the OHT vehicle to engage the material unit;

wherein the multiple parts include a first part, a second part configured to extend laterally from the first part, and a third part configured to extend laterally from the second part;

wherein the translating member is in the retracted configuration when (i) the first part, the second part, and the third part are positioned vertically on top of each other, (ii) the second part is unextended relative to the first part, and (iii) the third part is unextended relative to the second part and is positioned within the OHT vehicle;

wherein the translating member is in the extended configuration when (i) the second part is extended relative to the first part, and (ii) the third part is extended relative to the second part and is in the position exterior to the OHT vehicle; and a gripper mounted on an underside of the third part of the translating member and configured to engage the material unit from a position below the translating member and above the material unit at times when the translating member is in the extended configuration;

moving the overhead hoist to a position adjacent to the material storage location;

extending the translating member laterally, by the extended configuration, toward the side of the substantially horizontal overhead track to a position exterior to the overhead hoist and above the material unit held in the material storage location; and picking the material unit from the fixed shelf disposed at the side of the substantially overhead track by lowering the gripper from the extended configuration to engage the material unit.

15. The method of claim 14, wherein the material storage location is included in a plurality of levels of material storage locations.

16. The method of claim 15, wherein:
the side of the substantially horizontal overhead track comprises a first side of the substantially horizontal overhead track; and
the plurality of levels of material storage locations comprise (i) a first plurality of material storage locations arranged in respective pluralities of rows and columns at the first side of the substantially horizontal overhead track, and (ii) a second plurality of material storage locations arranged in respective pluralities of rows and columns at a second side of the substantially horizontal overhead track; and the second side of the substantially horizontal overhead track is opposite the first side of the substantially horizontal overhead track.

17. The method of claim 16, wherein:
the first plurality of material storage locations is configured to be suspended at the first side of the substantially horizontal overhead track; and
the second plurality of material storage locations is configured to be suspended at the second side of the substantially horizontal overhead track.

18. The method of claim 17, wherein the first and second pluralities of material storage locations are configured to be suspended from the ceiling.

19. The method of claim 15, wherein the plurality of levels of material storage locations is configured to be suspended from the ceiling.

20. The method of claim 14, wherein the at least one material unit comprises a Front Opening Unified Pod (FOUP).

21. The method of claim 14, wherein the at least one material unit comprises at least one manufactured part.

22. The method of claim 14, wherein the side of the substantially horizontal overhead track comprises a first side of the substantially horizontal overhead track, and the material storage location is disposed at a second side of the substantially horizontal overhead track, with the second side of the substantially horizontal overhead track being opposite the first side of the substantially horizontal overhead track.

23. The method of claim 22, wherein the track position comprises a first track position, the material unit comprises a first material unit, and wherein the method further comprises:
carrying the overhead hoist to a second track position along the substantially horizontal overhead track, with the second track position adjacent to the material storage location disposed at the second side of the substantially horizontal overhead track;
extending the translating member laterally relative to the substantially horizontal overhead track toward the second side of the substantially horizontal overhead track;
positioning the gripper at a position proximate to the material storage location disposed at the second side of the substantially horizontal overhead track; and
when the gripper is at the position proximate to the material storage location disposed at the second side of the substantially horizontal overhead track, performing one or more operations comprising:
picking a second material unit from the material storage location disposed at the second side of the substantially horizontal overhead track; and
placing the second material unit into the material storage location disposed at the second side of the substantially horizontal overhead track.

* * * * *